(12) United States Patent
Imani

(10) Patent No.: US 12,015,424 B2
(45) Date of Patent: Jun. 18, 2024

(54) NETWORK-BASED HYPERDIMENSIONAL SYSTEM

(71) Applicant: The Regents of the University of California, Oakland, CA (US)

(72) Inventor: Mohsen Imani, Irvine, CA (US)

(73) Assignee: The Regents of the University of California, Oakland, CA (US)

(*) Notice: Subject to any disclaimer, the term of this patent is extended or adjusted under 35 U.S.C. 154(b) by 21 days.

(21) Appl. No.: 17/895,177

(22) Filed: Aug. 25, 2022

(65) Prior Publication Data

US 2023/0083502 A1   Mar. 16, 2023

Related U.S. Application Data

(60) Provisional application No. 63/237,650, filed on Aug. 27, 2021.

(51) Int. Cl.
*H03M 13/00* (2006.01)
*H03M 13/11* (2006.01)

(52) U.S. Cl.
CPC .... *H03M 13/1108* (2013.01); *H03M 13/1128* (2013.01); *H03M 13/6312* (2013.01)

(58) Field of Classification Search
CPC ........... H03M 13/1108; H03M 13/611; H03M 13/63; H03M 13/6312; H03M 13/3746; H03M 13/3738; H03M 13/1128
See application file for complete search history.

(56) References Cited

U.S. PATENT DOCUMENTS

| | | | |
|---|---|---|---|
| 11,244,723 B1* | 2/2022 | Karunaratne | G06F 15/7867 |
| 11,409,752 B1* | 8/2022 | Qadrud-Din | G06F 40/126 |
| 11,455,161 B2* | 9/2022 | Prasad | G06F 18/214 |
| 2021/0327376 A1 | 10/2021 | Srinivasa | |
| 2022/0121931 A1* | 4/2022 | Kalarot | G06T 5/20 |
| 2022/0147758 A1 | 5/2022 | Hiromoto | |
| 2022/0198782 A1 | 6/2022 | Zhang et al. | |

OTHER PUBLICATIONS

Alaghi, A. et al., "The Promise and Challenge of Stochastic Computing," IEEE Transactions on Computer-Aided Design of Integrated Circuits and Systems, vol. 37, Issue 8, Aug. 2018, IEEE, 19 pages.

Alaghi, A. et al., "Survey of Stochastic Computing," ACM Transactions on Embedded Computing Systems, vol. 12, Issue 2s, Article No. 92, May 2013, 19 pages.

(Continued)

*Primary Examiner* — Esaw T Abraham
(74) *Attorney, Agent, or Firm* — Withrow & Terranova, P.L.L.C.

(57) ABSTRACT

Disclosed is a network-based hyperdimensional system having an encoder configured to receive input data and encode the input data using hyperdimensional computing to generate a hypervector having encoded data bits that represent the input data. The network-based hyperdimensional system further includes a decoder configured to receive the encoded data bits, decode the encoded data bits, and reconstruct the input data from the decoded data bits. In some embodiments, the encoder is configured for direct hyperdimensional learning on transmitted data with no need for data decoding by the decoder.

18 Claims, 13 Drawing Sheets

(56) References Cited

OTHER PUBLICATIONS

Angelova, A. et al., "Pruning training sets for learning of object categories," 2005 IEEE Computer Society Conference on Computer Vision and Pattern Recognition (CVPR'05), Jun. 20-25, 2005, San Diego, CA, USA, IEEE, 8 pages.

Anguita, D. et al., "Human Activity Recognition on Smartphones Using a Multiclass Hardware-Friendly Support Vector Machine," Proceedings of the 4th International Conference on Ambient Assisted Living and Home Care, Dec. 2012, 8 pages.

Bonomi, F. et al., "Fog computing and its role in the internet of things," MCC '12: Proceedings of the First Edition of the MCC workshop on Mobile Cloud Computing, Aug. 2012, ACM, pp. 13-15.

Ciresan, D. et al., "Multi-column Deep Neural Networks for Image Classification," IEEE Computer Society Conference on Computer Vision and Pattern Recognition, Feb. 2012, 8 pages.

Chen, X.-W. et al., "Big Data Deep Learning: Challenges and Perspectives," IEEE Access, vol. 2, May 2014, IEEE, 12 pages.

Chi, P. et al., "PRIME: A Novel Processing-in-Memory Architecture for Neural Network Computation in ReRAM-Based Main Memory," 2016 ACM/IEEE 43rd Annual International Symposium on Computer Architecture (ISCA), Jun. 18-22, 2016, Seoul, South Korea, IEEE, 13 pages.

Dua, D. et al., "UCI Machine Learning Repository," 2019, University of California, School of Information and Computer Science, Irvine, CA, [http://archive.ics.uci.edu/ml], 2 pages.

Hernandez-Cano, A. et al., "OnlineHD: Robust, Efficient, and Single-Pass Online Learning Using Hyperdimensional System," 2021 Design, Automation & Test in Europe Conference & Exhibition, Feb. 1-5, 2021, Grenoble, France, IEEE, 6 pages.

Hou, S. et al., "DualNet: Learn Complementary Features for Image Recognition," 2017 IEEE International Conference on Computer Vision (ICCV), Oct. 22-29, 2017, Venice, Italy, IEEE, 9 pages.

Imani, M. et al., "A Framework for Collaborative Learning in Secure High-Dimensional Space," 2019 IEEE 12th International Conference on Cloud Computing (CLOUD), Jul. 8-13, 2019, Milan, Italy, IEEE, 12 pages.

Imani, M. et al., "DUAL: Acceleration of Clustering Algorithms using Digital-based Processing In-Memory," 2020 53rd Annual IEEE/ACM International Symposium on Microarchitecture (MICRO), Oct. 17-21, 2020, Athens, Greece, IEEE, 16 pages.

Imani, M. et al., "FloatPIM: In-Memory Acceleration of Deep Neural Network Training with High Precision," 2019 ACM/IEEE 46th Annual International Symposium on Computer Architecture (ISCA), Jun. 22-26, 2019, Phoenix, AZ, USA, IEEE, 14 pages.

Imani, M. et al., "Revisiting HyperDimensional Learning for FPGA and Low-Power Architectures," 2021 IEEE International Symposium on High-Performance Computer Architecture (HPCA), Feb. 27-Mar. 3, 2021, Seoul, South Korea, IEEE, 14 pages.

Imani, M. et al., "SearcHD: A Memory-Centric Hyperdimensional Computing With Stochastic Training," IEEE Transactions on Computer-Aided Design of Integrated Circuits and Systems, vol. 39, Issue 10, Oct. 2020, first published Nov. 2019, IEEE, 13 pages.

Jouppi, N. et al., "In-Datacenter Performance Analysis of a Tensor Processing Unit," ISCA '17: Proceedings of the 14th Annual International Symposium on Computer Architecture, Jun. 2017, ACM, 12 pages.

Kanerva, P., "Hyperdimensional Computing: An Introduction to Computing in Distributed Representation with High-Dimensional Random Vectors," Cognitive Computation, vol. 1, No. 2, Jan. 2009, Springer Science +Business Media, LLC, 21 pages.

Kim, K. et al., "Dynamic energy-accuracy trade-off using stochastic computing in deep neural networks," 2016 53nd ACM/EDAC/IEEE Design Automation Conference (DAC), Jun. 5-9, 2016, Austin, TX, USA, IEEE, 6 pages.

Kotra, J. et al., "Re-NUCA: A Practical NUCA Architecture for ReRAM Based Last-Level Caches," 2016 IEEE International Parallel and Distributed Processing Symposium (IPDPS), May 23-27, 2016, Chicago, IL, USA, IEEE, 10 pages.

Kvatinsky, S. et al., "MAGIC—Memristor-Aided Logic," IEEE Transactions on Circuits and Systems—II: Express Briefs, vol. 61, No. 11, Nov. 2014, IEEE, pp. 895-899, 5 pages.

Kvatinsky, S. et al., "VTEAM: A General Model for Voltage-Controlled Memristors," IEEE Transactions on Circuits and Systems II: Express Briefs, vol. 62, Issue 8, Aug. 2015, first published May 2015, IEEE, 5 pages.

Lecun, Y. et al., "Gradient-based learning applied to document recognition," Proceedings of the IEEE, vol. 86, No. 11, Nov. 1998, IEEE, 46 pages.

Li, H. et al., "Hyperdimensional computing with 3D VRRAM in-memory kernels: Device-architecture co-design for energy-efficient, error-resilient language recognition," 2016 IEEE International Electron Devices Meeting (IEDM), Dec. 3-7, 2016, San Francisco, CA, USA, IEEE, 4 pages.

Liu, S. et al., "Energy efficient stochastic computing with Sobol sequences," Design, Automation & Test in Europe Conference & Exhibition (Date), Mar. 27-31, 2017, Lausanne, Switzerland, IEEE, 4 pages.

Mitrokhin, A. et al., "Learning sensorimotor control with neuromorphic sensors: Toward hyperdimensional active perception," Science Robotics, vol. 4, No. 30, May 2019, 11 pages.

Nazemi, M. et al., "SynergicLearning: Neural Network-Based Feature Extraction for Highly-Accurate Hyperdimensional Learning," arXiv:2007.15222v2 [cs.LG], Aug. 4, 2020, 9 pages.

Paszke, A. et al., "PyTorch: An Imperative Style, High-Performance Deep Learning Library," NIPS'19: Proceedings of the 33rd International Conference on Neural Information Processing Systems, Article No. 721, Dec. 2019 , 12 pages.

Rahimi, A. et al., "A Robust and Energy-Efficient Classifier Using Brain-Inspired Hyperdimensional Computing," ISLPED '16: Proceedings of the 2016 International Symposium on Low Power Electronics and Design, Aug. 2016, 6 pages.

Reiss, A. et al., "Introducing a New Benchmarked Dataset for Activity Monitoring," 2012 16th International Symposium on Wearable Computers, Jun. 18-22, 2012, Newcastle, UK, IEEE, 2 pages.

Shafiee, A. et al., "ISAAC: A Convolutional Neural Network Accelerator with In-Situ Analog Arithmetic in Crossbars," 2016 ACM/IEEE 43rd Annual International Symposium on Computer Architecture (ISCA), Jun. 18-22, 2016, Seoul, South Korea, IEEE.

Synopsys, "A New World of Innovation," https://www.synopsys.com, available as early as 2021, 9 pages.

Wu, T.F. et al., "Brain-inspired computing exploiting carbon nanotube FETs and resistive RAM: Hyperdimensional computing case study," 2018 IEEE International Solid—State Circuits Conference—(ISSCC), Feb. 11-15, 2018, San Francisco, CA, USA, IEEE, 3 pages.

Imani, M. et al., "A Binary Learning Framework for Hyperdimensional Computing," 2019 Design, Automation & Test in Europe Conference & Exhibition (Date), Mar. 25-29, 2019, Florence, Italy, IEEE, 6 pages.

Imani, M. et al., "BRIC: Locality-based Encoding for Energy-Efficient Brain-Inspired Hyperdimensional Computing," 2019 56th ACM/IEEE Design Automation Conference (DAC), Jun. 2-6, 2019, Las Vegas, NV, USA, IEEE, 6 pages.

Imani, M. et al., "Exploring Hyperdimensional Associative Memory," 2017 IEEE International Symposium on High Performance Computer Architecture (HPCA), Feb. 4-8, 2017, Austin, TX, IEEE, 12 pages.

Imani, M. et al., "Hierarchical Hyperdimensional Computing for Energy Efficient Classification," 2018 55th ACM/ESDA/IEEE Design Automation Conference (DAC), Jun. 24-28, 2018, San Francisco, CA, USA, IEEE, 6 pages.

Kim, Y. et al., "Efficient Human Activity Recognition Using Hyperdimensional Computing," IOT '18: Proceedings of the 8th International Conference on the Internet of Things, Article No. 38, Oct. 2018, 6 pages.

Non-Final Office Action for U.S. Appl. No. 17/744,371, dated Jun. 23, 2023, 17 pages.

Final Office Action for U.S. Appl. No. 17/744,371, dated Jan. 3, 2024, 15 pages.

(56) References Cited

OTHER PUBLICATIONS

U.S. Appl. No. 17/744,371, filed May 13, 2022.
U.S. Appl. No. 17/895,171, filed Aug. 25, 2022.
U.S. Appl. No. 17/895,173, filed Aug. 25, 2022.

* cited by examiner

NETWORK-BASED HYPERDIMENSIONAL SYSTEM

RELATED APPLICATIONS

This application claims the benefit of provisional patent application Ser. No. 63/237,650, filed Aug. 27, 2021, the disclosure of which is hereby incorporated herein by reference in its entirety.

GOVERNMENT SUPPORT

This invention was made with government funds under grant number N000142112225 awarded by the Department of the Navy, Office of Naval Research. The U.S. Government has rights in this invention.

FIELD OF THE DISCLOSURE

The present disclosure relates to artificial neural networks and in particular to hyperdimensional computing that is adaptive to changes in environment, data complexity, and data uncertainty.

BACKGROUND

Prior research has applied the idea of hyperdimensional computing (HDC) to diverse cognitive tasks, such as robotics, analogy-based reasoning, latent semantic analysis, language recognition, gesture recognition, bio-signal processing, one-shot classification, multimodal sensor fusion, and distributed sensors. Several recent works focus on designing a hyperdimensional encoding for different data types, for example, encoding for time-series and bio-signals, and expanding HDC mathematics to design brain-like memorization for robotic tasks. However, traditional encoding methods are for specific data types and learning applications. What is needed is a general encoding scheme that processes arbitrary bit-streams while preserving spatial-temporal information and in particular a new encoder that can encode data that can be directly used for learning or can be iteratively decoded back to original space.

SUMMARY

Disclosed is a network-based hyperdimensional system having an encoder configured to receive input data and encode the input data using hyperdimensional computing to generate a hypervector having encoded data bits that represent the input data. The network-based hyperdimensional system further includes a decoder configured to receive the encoded data bits, decode the encoded data bits, and reconstruct the input data from the decoded data bits. In some embodiments, the encoder is configured for direct hyperdimensional learning on transmitted data with no need for data decoding by the decoder.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure and, together with the description, serve to explain the principles of the disclosure.

DETAILED DESCRIPTION

Figure 1:
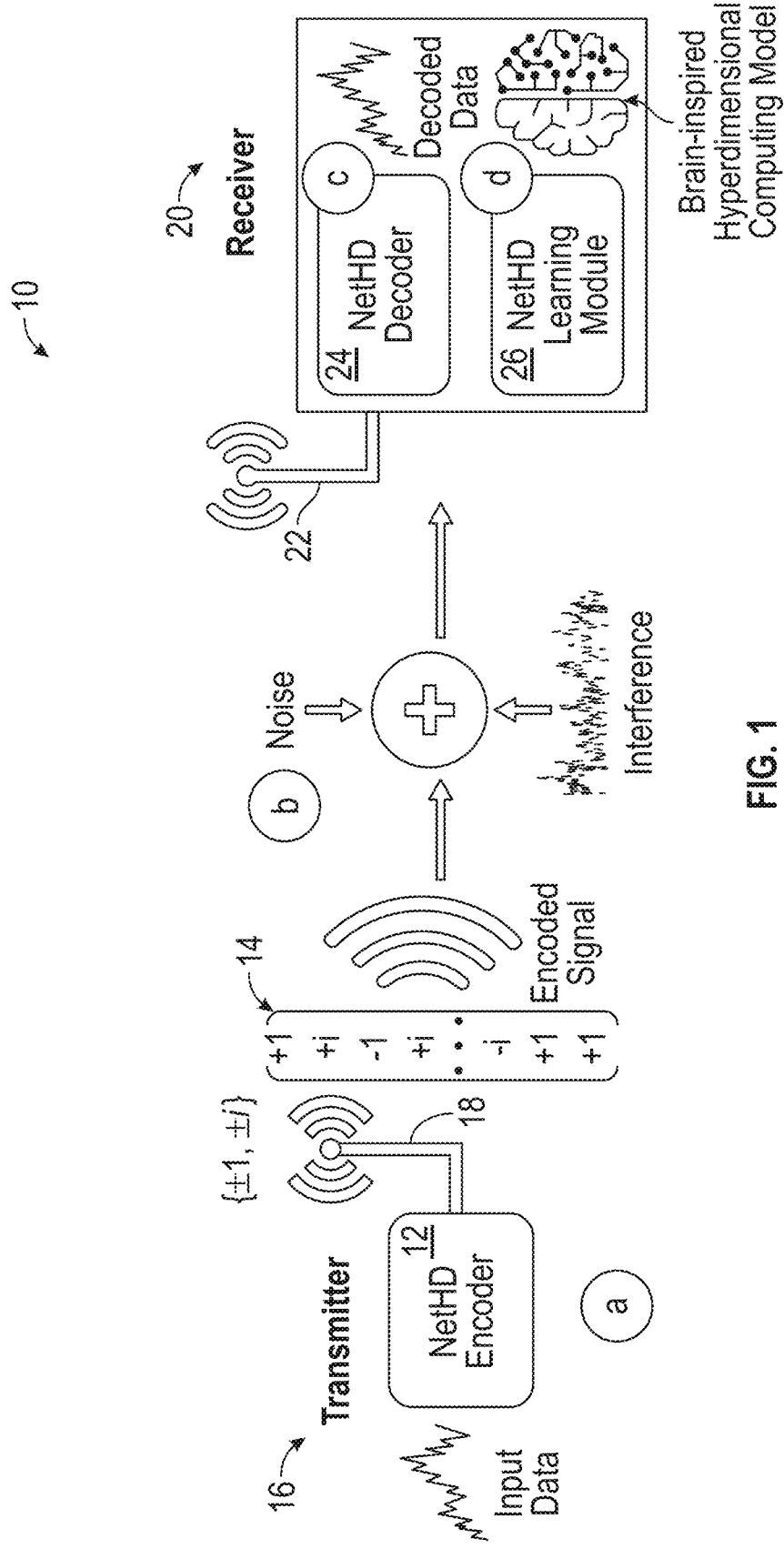
FIG. 1 is a diagram showing an overview of a network-based hyperdimensional system known herein as a NetHD system that enables efficient data communication and learning in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Edge computing tries to realize a distributed computing paradigm by bringing the computation closer to the location where the data are generated. These schemes transfer a large amount of streaming data to the cloud, making the system communication-bound. The existing network protocols typically use orthogonal modulation along with costly error correction code. These schemes impose significant overhead on ultra-low power Internet of Things (IoT) devices.

With the emergence of the IoT, a large number of embedded devices are deployed to collect data from the environment and produce information. To extract useful information, it is essential to run machine learning algorithms to assimilate the data collected in the swarm of devices on the IoT. The system efficiency relies on solid integration and co-optimization of learning and communication modules. However, there are the following challenges with the existing communication systems:

(i) Communication Cost: The existing data modulations typically use orthogonal modulation along with costly error correction code. These schemes impose significant overhead on ultra-low-power IoT devices.

(ii) Robustness to Noise: To reduce computation cost, IoT devices often access ultra-efficient network protocols that pose critical challenges in the face of unreliable wireless communication.

(iii) Learning Integration: Today's communication systems rely on many layers of information processing, from data compression and modulation by the sender to demodulation and decompression by the receiver.

Problematically, in existing systems, the communication and learning modules are kept and optimized separately, making the entire system inefficient to process machine learning algorithms.

Hyperdimensional computing (HDC) is introduced as an alternative computational model mimicking important brain functionalities towards holographic and noise-tolerant data representation. Hyperdimensional computing is motivated by the observation that the human brain operates on high-dimensional data representations. Hyperdimensional computing incorporates learning capability along with typical memory functions of storing and loading information by enabling vector operations that are computationally tractable and mathematically rigorous in describing human cognition.

In accordance with the present disclosure, FIG. 1 is a diagram that provides an overview of a network-based hyperdimensional system referred to herein as a NetHD system 10. Unlike existing communication protocols that use layered information processing, the NetHD system 10 combines communication with machine learning. An encoder 12 of the NetHD system 10 is configured to encode input data into a high-dimensional redundant and holographic representation of a hypervector 14 (a). The hypervector 14 preserves sufficient information even when a substantial number of hypervector elements making up the hypervector 14 are corrupted. The NetHD system 10 may employ a wireless transmitter 16 with a transmit antenna 18 to transfer the encoded data through a network. The network is often a noisy channel that adds both noise and interference to an encoded signal onto which the encoded data is carried (b). A receiver 20 receives the noisy data of the encoded signal through a receive antenna 22 and has two options: (1) decode the data back to the original space through a decoder 24 (c) or (2) directly operate hyperdimensional learning over the encoded data with no need for costly data decoding (d). With respect to (1), disclosed is a lightweight iterative method that decodes the transmitted data without using any error correction. The decoding solution is significantly robust against low signal-to-noise (SNR) networks and interference. With respect to (2), the NetHD system 10 enables various hyperdimensional learning over transmitted data, including classification and clustering through a learning module 26. Also, dynamic data compression during encoding is provided by the NetHD system 10 to trade between accuracy and communication cost.

The disclosed embodiments of the network-based hyperdimensional system are known herein as the NetHD system 10. The disclosed NetHD system 10 provides for ultra-efficient and robust data communication and learning. Moreover, the NetHD system 10 uses a redundant and holographic representation of HDC to realize highly robust data modulation. Since HDC encoding spreads the data over the relatively large hypervector 14, a substantial number of bits can be corrupted while preserving sufficient information, resulting in high noise robustness. The NetHD system 10 enables two functionalities over transmitted data: (1) an iterative decoding method which translates the vector back to the original data with no error correction mechanisms, or (2) a native hyperdimensional learning technique on transmitted data with no need for costly data decoding. The evaluation shows that the NetHD system 10 provides a comparable bit error rate to state-of-the-art modulation schemes while fundamentally merging communication and machine learning. A hardware accelerator that supports both data decoding and hyperdimensional learning using emerging memory technology is also disclosed further in this disclosure. Evaluation shows that NetHD can achieve 9.4× and 27.8× faster and higher energy efficiency compared with a deep neural network (DNN), respectively.

The NetHD system 10 is well suited to address the communication and learning challenges in IoT systems, for (i) HDC enables one-pass real-time learning and cognitive supports, (ii) the models are computationally efficient to training and are highly parallel, (iii) HDC representation provides strong robustness to noise—a key strength for unreliable networks, (iv) HDC offers an intuitive and human-interpretable model, and (v) HDC can naturally enable light-weight privacy and security.

Along with hyperdimensional learning, hyperdimensional modulation (HDM) is introduced as a modulation scheme designed for ultra-reliable low latency communication. Hyperdimensional modulation already shows more reliability than binary phase-shift keying (BPSK) protected by state-of-the-art low density parity check (LDPC) and polar error correction codes for the same spectral efficiency. In addition, HDM has lower complexity than LDPC, Polar, and convolutional codes. However, there are multiple challenges with existing HDM modulations:

(1) The HDM decoding or demodulation is a costly iterative process that involves extensive search for noise cancellation.
(2) The HDM is only focused on modulation and does not get the superior benefit of HDC.

Hyperdimensional computing is a natural cognitive computing model with superior capability for robust and real-time learning in IoT devices. The current HDM modulations are only designed for low-cost and reliable communication and do not aim to optimize the efficiency of an end-to-end learning task in IoT systems. The learning process involves both data communication and computation; thus, an optimized scheme should integrate modulation with hyperdimensional learning to maximize the benefit.

In general terms, the NetHD system 10 reduces the distance between computation and communication. The NetHD encoder 12 includes encoding methods that map data into high-dimensional space and transmit the encoded data through the network. The encoded data can be directly used at the destination node to perform a wide range of HDC-based learning tasks or to accurately decode data back to the original space. The advantages include, but are not limited to, the following:

- Design of an encoding method that exploits redundant and holographic HDC representation for ultra-efficient and robust data communication. The encoder utilizes HDC symbolic representation to distribute information among long vectors. Since HDC encoding spreads the data over the hypervector 14, a substantial number of bits can be corrupted while preserving sufficient information, resulting in high noise robustness.
- An iterative decoding method that recovers originally transmitted data with very few iterations. With holographic representation provided by the NetHD encoder 10, decoding can successfully demodulate the hypervector 14 in low SNR scenarios with no error correction mechanism. The NetHD encoder 12 can also adaptively change the coding rate. Unlike existing protocols, the NetHD encoder 12 is tolerant to packet collision and interference. This makes the solution according to the present disclosure promising for ultra-low latency IoT networks with a high rate of packet collision.
- Unlike existing learning solutions that aim to optimize computation and communication separately, the present disclosure introduces an approach implemented by the NetHD system 10 that fundamentally merges data modulation and learning. The NetHD system 10 implements the hyperdimensional learning directly over transmitted data with no need for costly iterative data decoding. In addition, the NetHD system 10 includes the robustness of hyperdimensional learning to enable approximate and highly compressed data modulation. The NetHD system 10 enables single-pass and iterative classification over transmitted data, thus minimizing total system energy consumption.
- Design of a hardware accelerator that offloads search-based operation to content addressable memory with row parallel search operation to enable fast and efficient data decoding. The hardware accelerator supports the nearest search over complex values. Also disclosed is a statistical approach that accurately computes error recovery for the NetHD system 10 depending on different encoding parameters.

The NetHD system 10 was evaluated over a wide range of network conditions and under various SNR scenarios. Evaluation shows that the NetHD system 10 provides a comparable bit error rate to state-of-the-art modulation schemes while fundamentally merging HDM and learning. The NetHD system 10 is configured to at least achieve 9.4× and 27.8×faster and higher energy efficiency compared to a DNN, respectively. A content addressable memory (CAM)-based hardware accelerator results in 108.3× and 27.1× (35.8× and 22.0×) faster and higher energy efficiency during data decoding (learning) than an embedded graphics processor unit (GPU).

Brain-inspired HDC is a neurally inspired computing model based on the observation that the human brain operates on high-dimensional and distributed representations of data. The fundamental units of computation in HDC are high-dimensional representations of data that make up hypervectors, such as the hypervector 14, which are constructed from raw signals using an encoding procedure implemented by the encoder 12. There exist a large number of different, nearly orthogonal hypervectors with the dimensionality in the thousands. This permits combining such hypervectors into a new hypervector using well-defined vector space operations while keeping the information of the two with high probability. Hypervectors are holographic and (pseudo)random with independent identically distributed components. A hypervector contains all the information combined and spread across all its components in a full holistic representation so that no component is more responsible to store any piece of information than another.

Hyperdimensional Mathematics

Assume $\vec{\mathcal{H}}_1$, $\vec{\mathcal{H}}_2$ are two randomly generated hypervectors ($\vec{\mathcal{H}} \in \{-1, +1\}^D$) and $\delta(\vec{\mathcal{H}}_1, \vec{\mathcal{H}}_2) \approx 0$.

Binding(*) of two hypervectors $\vec{\mathcal{H}}_1$ and $\vec{\mathcal{H}}_2$ is done by component-wise multiplication (XOR in binary) and is denoted as $\vec{\mathcal{H}}_1 * \vec{\mathcal{H}}_2$. The result of the operation is a new hypervector that is dissimilar to its constituent vectors, that is, $\delta(\vec{\mathcal{H}}_1 * \vec{\mathcal{H}}_2, \vec{\mathcal{H}}_1) \approx 0$; thus binding is well suited for associating two hypervectors. Binding is used for variable-value association and, more generally, for mapping.

Bundling(+) operation is done via component-wise addition of hypervectors, denoted as $\vec{\mathcal{H}}_1 + \vec{\mathcal{H}}_2$. The bundling is a memorization function that keeps the information of input data into a bundled vector. The bundled hypervectors preserve similarity to their component hypervectors, that is, $\delta(\vec{\mathcal{H}}_1 + \vec{\mathcal{H}}_2, \vec{\mathcal{H}}_1) >> 0$. Hence, the majority function is well suited for representing sets.

Permutation ($\rho$) operation, $\rho^n(\vec{\mathcal{H}})$, shuffles components of $\vec{\mathcal{H}}$ with n-bit(s) of rotation. The intriguing property of the permutation is that it creates a near-orthogonal and reversible hypervector to $\vec{\mathcal{H}}$, that is, $\delta(\rho^n(\vec{\mathcal{H}}), \vec{\mathcal{H}}) \cong 0$ when $n \neq 0$ and $\rho^{-n}(\rho^n(\vec{\mathcal{H}})) = \vec{\mathcal{H}}$, which thus can be used to represent sequences and orders.

Similarity or Reasoning between two vectors $\vec{\mathcal{H}}_1$ and $\vec{\mathcal{H}}_2$ is defined to be $$\delta(\vec{\mathcal{H}}_1, \vec{\mathcal{H}}_2) = \vec{\mathcal{H}}_1^\dagger \cdot \vec{\mathcal{H}}_2 / D,$$

where $\vec{\mathcal{H}}_1$ and $\vec{\mathcal{H}}_2$ are assumed to be two complex vectors, and the † operation transposes the column vector and takes the conjugate of every component. This similarity operation gives a complex scalar value.

Encoding Provided by the NetHD Encoder of the NetHD System

Figure 2:
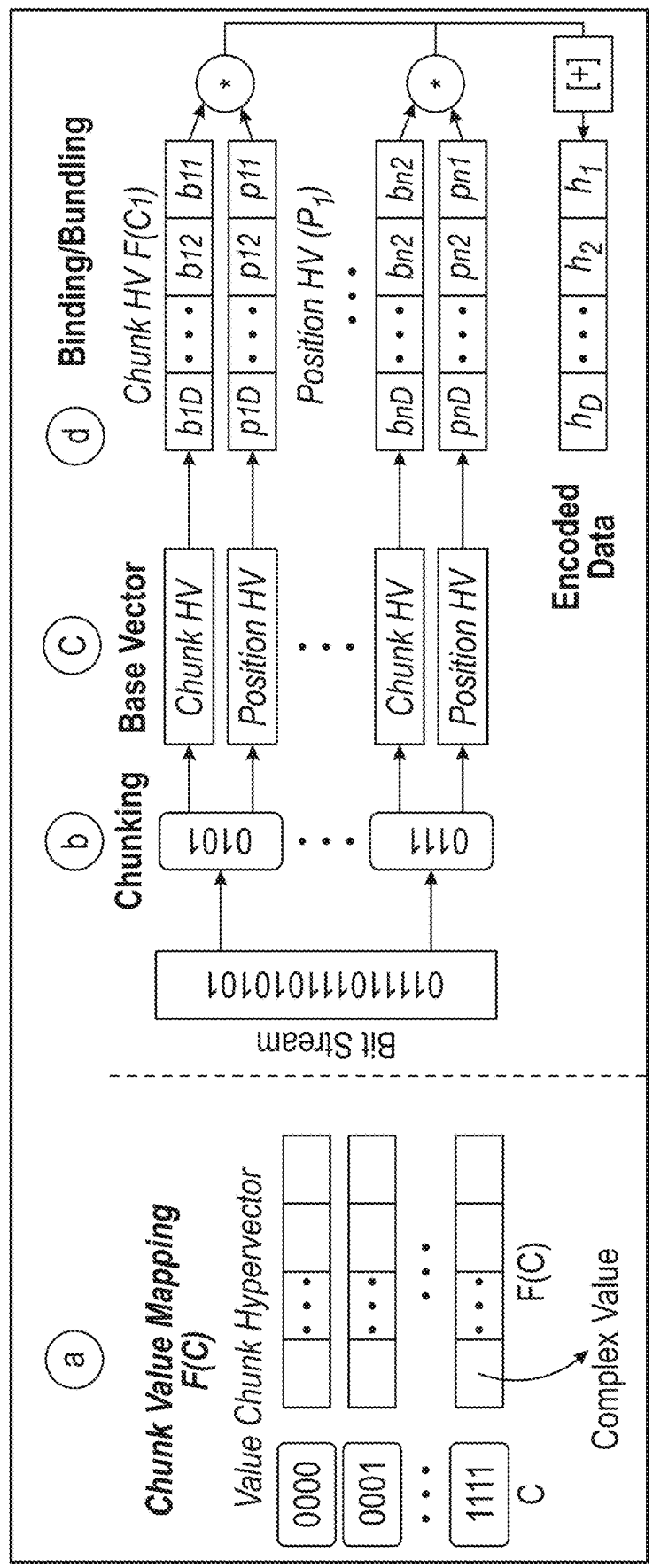
FIG. 2 is a diagram showing the encoding process provided by a NetHD encoder of the NetHD system.

FIG. 2 is a diagram of an exemplary encoding process implemented by the NetHD encoder 12 design for encoding that maps an arbitrary bit stream into high-dimensional space. The encoding provided by the NetHD encoder 12 exploits HDC mathematics to preserve all information of data in the encoded hypervector 14. Assume a bitstream is stored as an array $\vec{S}$ with length of L ($\vec{S} \in \{0, 1\}^n$). The goal is to map this bitstream into a hypervector $\vec{\mathcal{H}}$, where $\vec{\mathcal{H}} \in \{0, 1\}^D$. The encoding happens using the following steps:

Chunk Mapping: The input bit stream is divided into V chunks, of length L/V each. Define the $i^{th}$ chunk to be $$C_i = S\left[(i-1) \cdot \frac{L}{V} : i \cdot \frac{L}{V}\right]$$

for i=1, 2, 3, . . . , V. A mapping is constructed that takes a $$\frac{L}{V}$$

digit binary vector and maps it to a random high-dimensional vector. Call this mapping $\vec{\mathcal{F}}$ (x), where x is a $$\frac{L}{V}$$

digit vector. The goal of this function is to represent each chunk using random hypervectors, $\vec{\mathcal{F}}$ (x) for i=1, 2, . . . , V, with nearly orthogonal distribution, meaning that $\delta(F(C_i), F(C_j)) \cong 0$ for i≠j. The orthogonality of hypervectors is ensured as long as the hypervector dimension, D, is large enough compared with the number of features (D>>V) in the original data.

Preserve Position: To differentiate between feature locations, a unique random base hypervector is associated to each chunk position, that is, $\{\vec{\mathcal{P}}_1, \vec{\mathcal{P}}_2, \ldots, \vec{\mathcal{P}}_V\}$, where $\delta(\vec{\mathcal{P}}_i, \vec{\mathcal{P}}_j) \cong 0$ for i≠j. These position hypervectors identify the chunk to which the input belongs.

Encoding: The signal is encoded by associating each chunk hypervector with a corresponding position hypervector. For example, $\vec{\mathcal{T}}_1 * \vec{\mathcal{F}}(C_1)$ associates the value and position of first chunk as a new hypervector. The bundling of all associated hypervectors over all chunks memorizes the entire bit stream:

$$\vec{\mathcal{H}} = \frac{1}{\sqrt{V}} \sum_{i=1}^{V} \vec{\mathcal{P}}_i * \vec{\mathcal{F}}(C_i) \qquad (1)$$

The equation mathematically preserves the value and position of all chunks in a single holographic representation in high-dimensional space. The encoding also constructs signal normalization. Since encoding spreads the data over the relatively large hypervector 14, a substantial number of bits can be corrupted while preserving sufficient information, resulting in high noise robustness.

Functionality of the NetHD encoder 12 is explained using an example. Assume a stream of length L=16, S=0110111001011000. Divide this bit stream into V=4 chunks, $C_1$=0110, $C_2$=1110, $C_3$=0101, and $C_4$=1000, where each chunk has length L/V=4. A function or lookup table is constructed that maps each 4-digit binary number to a randomly generated hypervector ($\{\vec{\mathcal{F}}(C_1), \vec{\mathcal{F}}(C_2), \vec{\mathcal{F}}(C_3), \vec{\mathcal{F}}(C_4)\}$). Similarly, a position hypervector, $\{\vec{\mathcal{P}}_1, \vec{\mathcal{P}}_2, \vec{\mathcal{P}}_3, \vec{\mathcal{P}}_4\}$, is generated for each chunk. Using these two bases, the bit stream is encoded as follows:

$$\vec{\mathcal{H}} = \frac{1}{\sqrt{4}}(\vec{\mathcal{P}}_1 * \vec{\mathcal{F}}(C_1) + \vec{\mathcal{P}}_2 * \vec{\mathcal{F}}(C_2) + \ldots + \vec{\mathcal{P}}_4 * \vec{\mathcal{F}}(C_4))$$

In the example, the encoded hypervectors have dimensionality ranging from D=128 to D=512.

Complex Bases: Each component is selected from a list of complex phase values with an average value of 0. Traditionally, hyperdimensional computing chooses binary ($\{0, 1\}$) or polarized vectors ($\{-1, +1\}$) with uniformly distributed components because the corresponding vectors enable the associative reasoning via the bundling, which must be an invertible operation to recover the associations stored in memory. This restricts the choice of components to polarized vectors so that the bound vectors can be unbound using the component hypervectors. For example, assuming $\vec{\mathcal{B}} = \vec{\mathcal{H}}_1 * \vec{\mathcal{H}}_2$, the components can be recovered using $\vec{\mathcal{B}} * \vec{\mathcal{H}}_1 = \vec{\mathcal{H}}_2$. This restricts the capacity of the HDC vectors due to a lower number of possible hypervectors.

However, the ability to send hypervectors with complex phases in the signal enables expansion of the capacity of HDC vectors because now the component of vectors can be chosen to be any complex phase value that has a magnitude of 1. If the memory vector is now $\vec{\mathcal{B}} = \vec{\mathcal{H}}_1 * \vec{\mathcal{H}}_2$, the unbinding operation is given by $\vec{\mathcal{B}} * \vec{\mathcal{H}}_1 = \vec{\mathcal{H}}_2$, where $\vec{\mathcal{H}}_1$ is the vector with each component of $\vec{\mathcal{H}}_1$ conjugated. This increases the capacity of the random vectors because the possible random vectors increase exponentially with the symbol set size. The possible symbol set from which to choose the components is called S. In this disclosure, the set S is mainly chosen to be $\{\pm 1, \pm i\}$.

Figure 3A:
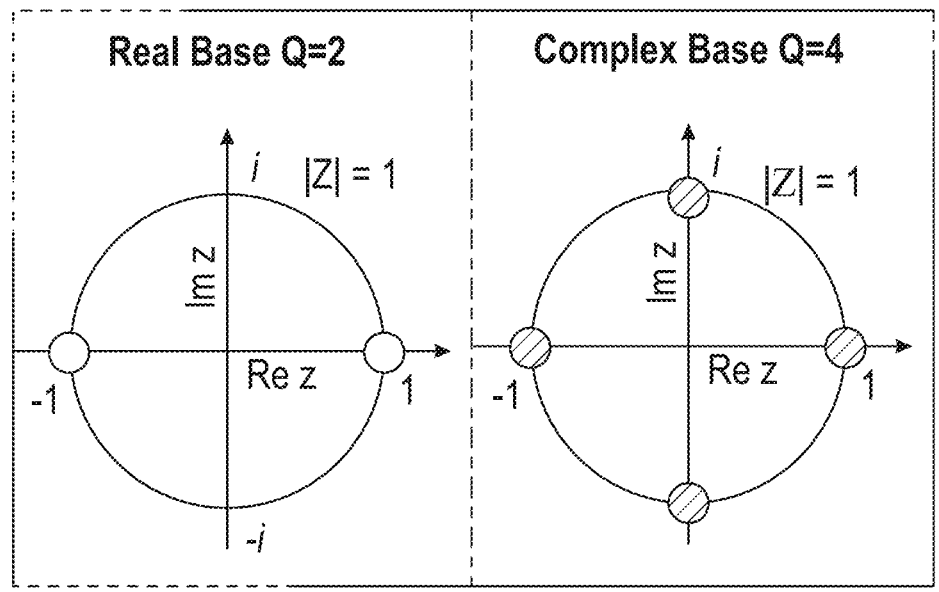
FIG. 3A is a diagram showing a symbol set selection according to the present disclosure.
Figure 3B:
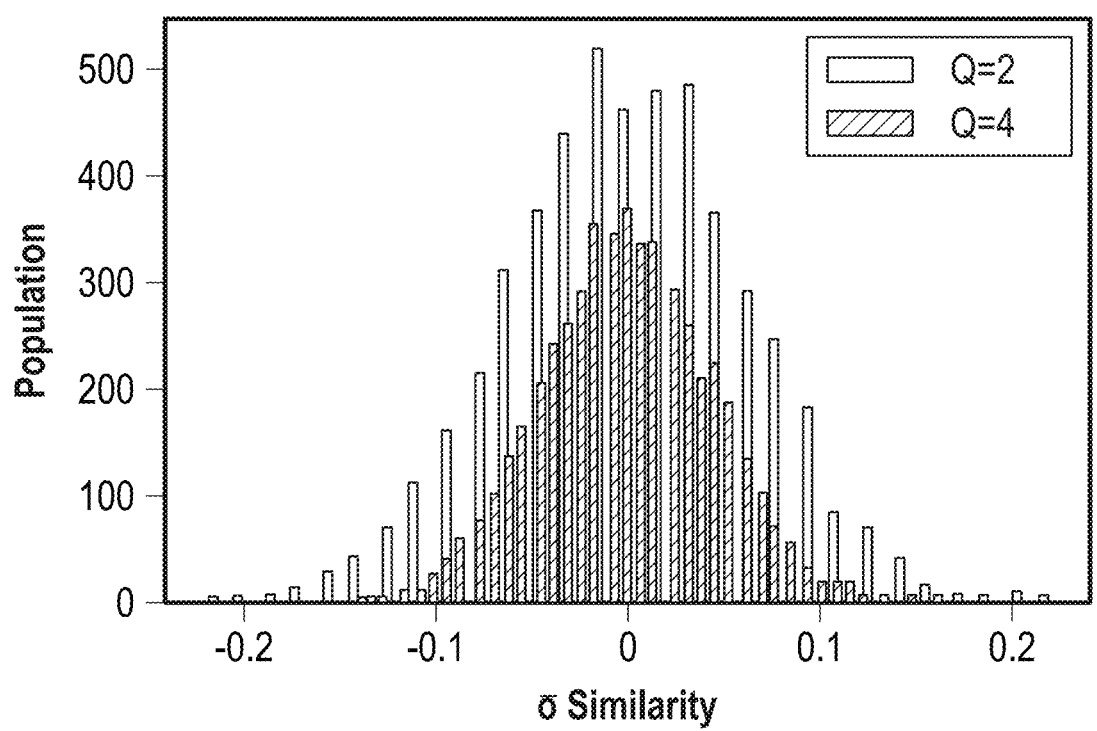
FIG. 3B is a graph showing a similarity distribution using different real and complex symbols based on FIG. 3A.

FIG. 3A is a diagram depicting possible choices that the NetHD encoder may choose in selecting polarized or complex bases. FIG. 3B is a diagram showing a similarity distribution of randomly generated hypervectors using bipolar and complex bases. The results indicate that random complex vectors have a higher chance of orthogonality, thus showing a narrower distribution.

NetHD Demodulation

Decoding Provided by the NetHD Decoder

Figure 4:
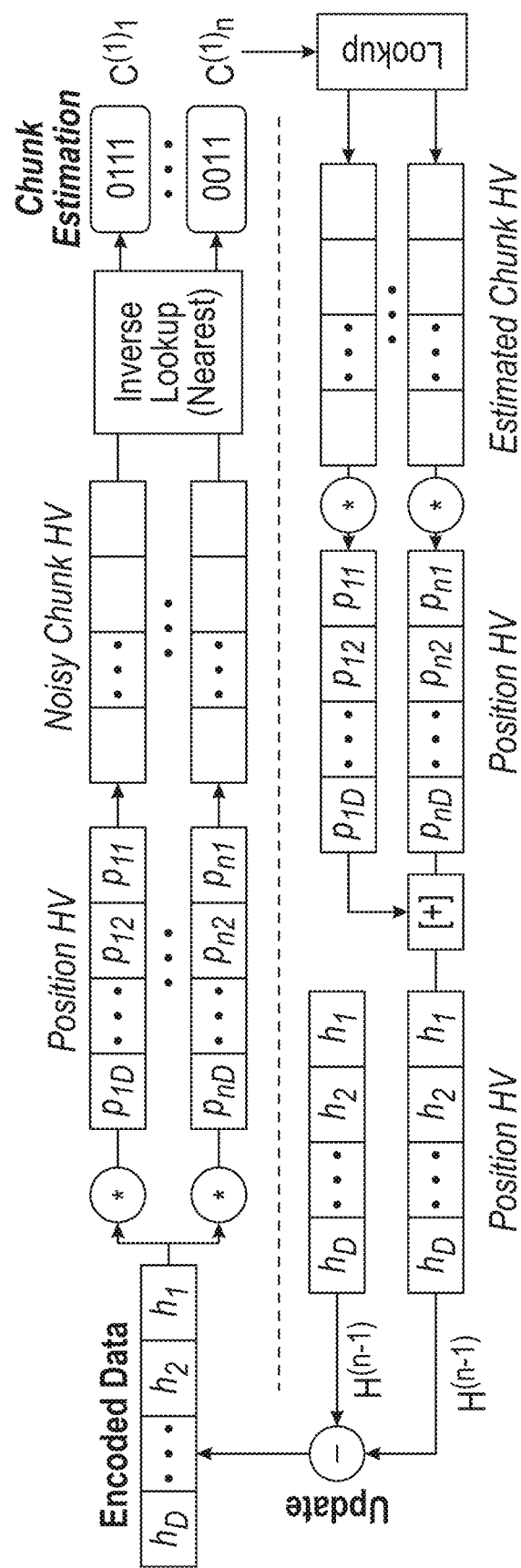
FIG. 4 is a diagram showing iterative decoding provided by a NetHD decoder of the NetHD system.

As depicted in a exemplary decoding diagram of FIG. 4, the NetHD decoder 24 (FIG. 1) decodes works via a brute-force search, which iterates through all possible bit sequences to find the best match and reconstruct the sequence. Suppose given a signal $\vec{\mathcal{H}}$, the NetHD decoder 24 uses an iterative decoding process to reconstruct the bit stream that successively cancels the predicted noise to attain more accurate guesses.

In the first iteration, the guess values of the chunks $C_i^{(0)}$ are found using the following:

$$\vec{\mathcal{P}}_k * \vec{\mathcal{H}} = \underbrace{(\overline{\vec{\mathcal{P}}_k} * \vec{\mathcal{P}}_k)}_{1} * \vec{\mathcal{F}}(C_k) + \sum_{i=1}^{N} \underbrace{(\overline{\vec{\mathcal{P}}_k} * \vec{\mathcal{P}}_i)}_{Noise \approx 0} * \vec{\mathcal{F}}(C_i) \quad (2)$$

This equation gives a noisy estimation of $\vec{\mathcal{F}}(C_k)$. This estimation is used to recover the actual chunk original value using the following:

$$C_i^{(1)} = \text{argmax}_{\forall C} \text{ Re } \delta(\vec{\mathcal{F}}(C), \overline{\vec{\mathcal{P}}_i} * \vec{\mathcal{H}})$$

In fact, this equation searches through pre-stored lookup table entries to find a chunk hypervector that has the highest similarity to the noisy estimation. Since the values are represented using the complex number, the search is performed using dot product operation. A lookup table entry with the highest similarity (real part) is the first estimation of the chunk value. This process continues for all chunks to get the first estimation.

This process continues iteratively to find a better estimation for the chunk value. The estimation is used to reduce the noise term in Equation 3. For the nth iteration, $$\vec{\mathcal{H}}^{(n-1)} = \vec{\mathcal{H}} - \frac{1}{\sqrt{V}} \sum_{i \neq j} \vec{\mathcal{P}}_i * \vec{\mathcal{F}}(C_i^{(n-1)}) \quad (3)$$

For the nth iteration, $C_i^{(n)}$ is found by $$C_i^{(n)} = \text{argmax}_{\forall C} \text{ Re } \delta(\vec{\mathcal{F}}(C), \overline{\vec{\mathcal{P}}_i} * \vec{\mathcal{H}}^{(n-1)}) \quad (4)$$

The foregoing iterative process is repeated until convergence. As shown subsequently, decoding provided by the NetHD decoder 10 often converges within 10 iterations.

Noise and Error Recovery

The signal vector $\mathcal{H}_0$ is normalized to $\delta(\mathcal{H}_0, \mathcal{H}_0)=1$. On the signal vector is overlayed a complex Gaussian noise vector $\vec{\mathcal{N}}$, the magnitude of which is distributed with a normal distribution with mean 0 and variance 1/n. The total signal transmitted is given by $\vec{\mathcal{H}} = \vec{\mathcal{H}}_0 + \vec{\mathcal{N}}$. The SNR is defined at 10 $\log_{10}$ n in decibels.

The error due to cross-interference of terms primary depends on the dimension of the hyperdimensional vectors D, the number of layers V, and the symbol set used. The error terms are given by $$\frac{1}{\sqrt{V}} \sum_{k \neq j} \vec{\mathcal{P}}_i * \vec{\mathcal{F}}(C_i^{(n-1)}) = \frac{1}{\sqrt{V}} \sum_{k=1}^{V-1} \vec{V}_i$$

where $\vec{V}_i$ are random uncorrelated vectors. Given a vector representing a value, $\vec{\mathcal{R}}$, the following can be calculated:

$$\text{Re}\delta\left(\vec{\mathcal{R}}, \frac{1}{\sqrt{V}} \sum_{k=1}^{V-1} \vec{V}_i\right) = \frac{1}{\sqrt{V}} \sum_{k=1}^{V-1} \text{Re}\delta(\vec{\mathcal{R}}, \vec{V}_i)$$

The distributions for this error shall be estimated theoretically and demonstrated experimentally.

The problem now reduces to estimating the real similarity distribution between two random vectors $\vec{\mathcal{A}}$ and $\vec{\mathcal{B}}$. The similarity can be written as $$\delta(\vec{\mathcal{A}}, \vec{\mathcal{B}}) = \Sigma_{i=1}^{D} (\vec{\mathcal{A}})_i (\vec{\mathcal{B}})_i$$

where $(\vec{\mathcal{A}})_i$ denotes the ith component of the vector $\vec{\mathcal{A}}$. Note that if $\vec{\mathcal{A}}$ and $\vec{\mathcal{B}}$ are random with components from the set S, then $(\vec{\mathcal{A}})_i(\vec{\mathcal{B}})_i$ is also a random element of the set S. The set S is in general parametrized by $$\left\{ e^{\frac{2\pi k}{Q}i} \right\},$$

where k=0, 1, 2, . . . , $Q$ −1 and $Q$ is an integer. The real parts of the set S are given by $$S_r = \left\{ \cos\frac{2\pi k}{Q} \right\}.$$

Thus, Re $(\vec{\mathcal{A}})_i(\vec{\mathcal{B}})_i$ is a random element of the set $S_r$. $S_r$ has a mean µ=0 and standard distribution of $$\sigma = \sqrt{\sum_{k=0}^{Q-1} \frac{\cos^2 \frac{2\pi k}{Q}}{Q}}$$

As the dimension increases, the real similarity between two random vectors is distributed as a Gaussian with a mean 0 and standard deviation $$\frac{\sigma}{\sqrt{D}}$$

by the central limit theorem. Thus, $$\mathrm{Re}\delta(\vec{\mathcal{A}}, \vec{\mathcal{B}}) \sim N\left(0, \frac{\sigma}{\sqrt{D}}\right)$$

Therefore, for more general cases, there is $$\mathrm{Re}\delta\left(\vec{\mathcal{R}}, \frac{1}{\sqrt{V}} \sum_{i=1}^{V-1} \vec{\mathcal{V}}_i\right) \sim N\left(0, \frac{\sigma}{\sqrt{D}}\right)$$

This equation shows that the contribution from the cross-interference is independent of V. However, note that the term matching with $\vec{\mathcal{R}}$ is normalized by the weight of $$\frac{1}{\sqrt{V}}.$$

Thus, the SNR from the cross-terms is given by 10

$$\log_{10} \frac{\sqrt{D}}{\sigma \sqrt{V}}.$$

Note that σ decreases by increasing $Q$. Thus, the three ways to decrease the noise are by increasing D, increasing $Q$, and decreasing V. However, each method has its own trade-off. Increasing D lowers the coding rate since a larger number of packets need to be transmitted. Increasing $Q$ makes the symbols more closely spaced, thus resulting in the need for receiver equipment to distinguish between closely spaced symbols. Decreasing V increases the size of the chunks, thus resulting in a larger memory requirement to store all possible bit sequences.

Learning in High-Dimension

Internet of Things devices generate and transmit streaming data. This data often needs to be processed by machine learning algorithms to extract useful information. The system efficiency comes from both communication and computation. Unfortunately, in today's systems, these two modules are separated and are optimized individually. For example, to learn the pattern of transmitted data, one still needs to pay the cost of iterative data decoding.

Disclosed is a solution that helps to decrease the distance between learning and communication. Instead of paying the cost of iterative data decoding, the NetHD system 10 enables hyperdimensional learning to directly operate over transmitted data, with no need for costly iterative decoding. Particularly, hyperdimensional classification and clustering are enabled over transmitted data. The NetHD system 10 also introduces a trade-off between the learning accuracy and communication cost by dynamically changing the data compression rate in the encoding module.

Learning Encoding

Figure 5A:
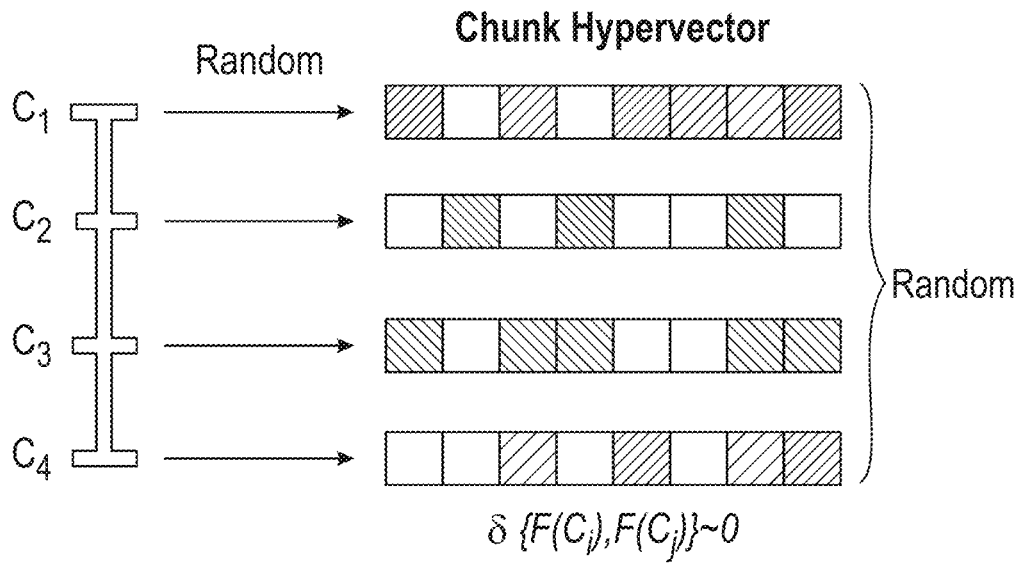
FIGS. 5A and 5B are diagrams showing random base generation for data transmission and correlative base generation provided by the NetHD system, respectively, according to the present disclosure.

The NetHD encoder 12 (FIG. 1) maps data points into high-dimensional space. The goal of the NetHD encoder 12 is to represent each datum as an orthogonal point unless the data are identical, as shown a diagram in FIG. 5A. This feature is essential for accurate data decoding. However, up until now the NetHD encoder 12 is not ideal for HDC learning. Hyperdimensional computer learning naturally works by clustering data points that are non-linearly mapped into high-dimensional space. To ease data clustering, the NetHD encoder 12 is further configured to preserve the correlation between input data.

Figure 5B:
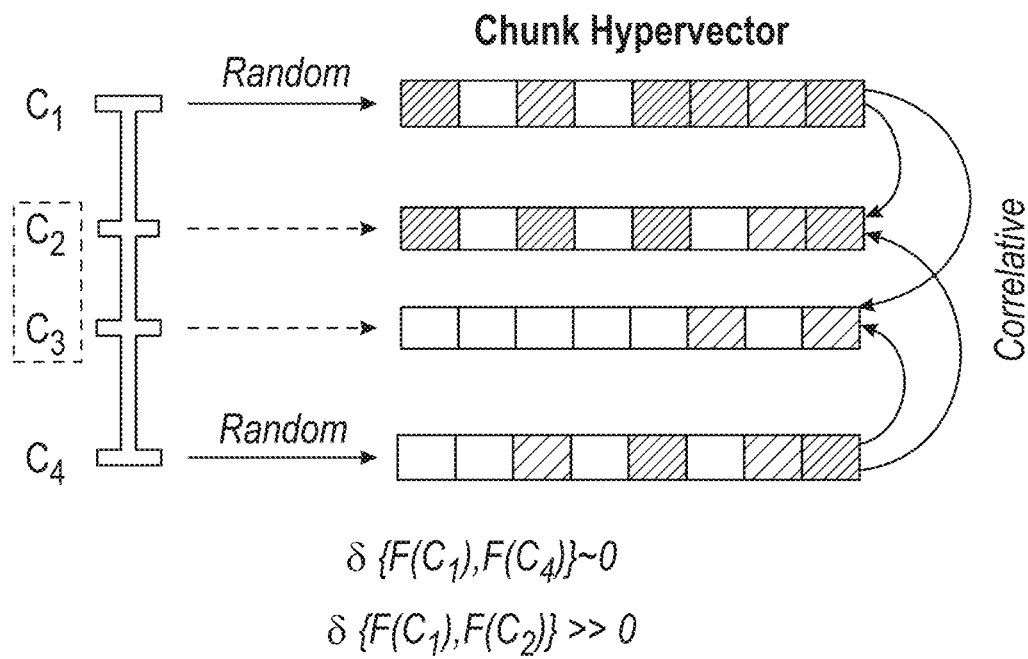

Correlative Bases: As explained previously, chunk hypervectors, $\vec{\mathcal{F}}$ (C), have been selected to uniquely map each $$\frac{L}{V} -$$

digit binary vector (chunk) into an orthogonal datum in high-dimensional space. To preserve correlation, the function needs to map physically correlated chunks to similar vectors in high-dimensional space. A quantization method is used as a map function that generates correlated hypervectors for chunks. FIG. 5B is a diagram depicting a map function that generates a random hypervector for the first chunk, $\vec{\mathcal{F}}$ (C$_1$). A remainder of the chunk hypervectors are generated by flipping random dimensions of $\vec{\mathcal{H}}_1$. For example, $\vec{\mathcal{H}}_i$ is generated by flipping D/$2^{L/V+1}$ dimensions of $\vec{\mathcal{H}}_{i-1}$. Since HDC learning is approximate, to ease the encoding module, a group of neighbor chunks can also be assigned to a single chunk hypervector. For example, to represent L=8-bit chunks ideally requires 256 chunk hypervectors. However, this precision is not required of learning, and thus chunk values can be quantized to much smaller values, for example, 16-bit or 8-bit chunk hypervectors.

Data Structured Encoding: Using a new mapping function, the same encoding as Equation 1 can be used to map data points into HDC space. The size of the chunk and the correlation of position hypervectors may change depending on the data structure. For example, if the encoded data corresponds to time-series with 8-bit precision values, the chunk size equal to 8 bits can be used. In addition, the position hypervector can be correlated for data with a structure. For example, for a time series the neighbor position hypervectors should have a higher correlation. One important note is that HDC learning works accurately even with random position hypervectors. The method according to the present disclosure in using correlative position hypervector only decreases the required dimensionality that maximizes HDC quality of learning. For complex representation such as floating point, the NetHD encoder 12 can quantize the values into a representation supported by the NetHD encoder 12. For example, a 32-bit floating point representation can be quantized to 8 bits before encoding.

Classification Provided by the NetHD System 10

Figure 6A:
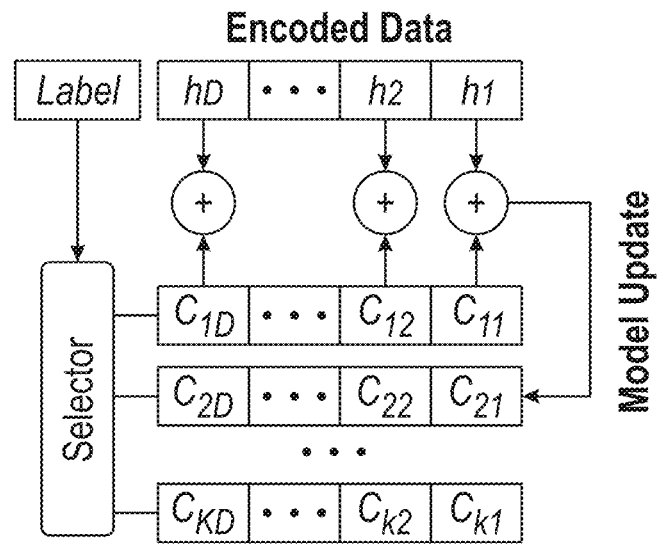
FIGS. 6A and 6B are diagrams showing hyperdimensional computing (HDC) classification steps and single-pass training, respectively, according to the present disclosure.

Training: Hyperdimensional computing training starts with accumulating all encoded hypervectors corresponding to each class. FIG. 6A is a diagram depicting single-pass training showing the result is k hypervectors with D dimensions, where k is the number of classes. Assuming there are $\mathcal{T}$ inputs having label l:

$$\vec{C}_l = \sum_j^{\mathcal{T}} \vec{\mathcal{H}}_j^l \quad (5)$$

Hyperdimensional computing also supports iterative training, but that comes at the cost of higher training time and energy.

Figure 6B:
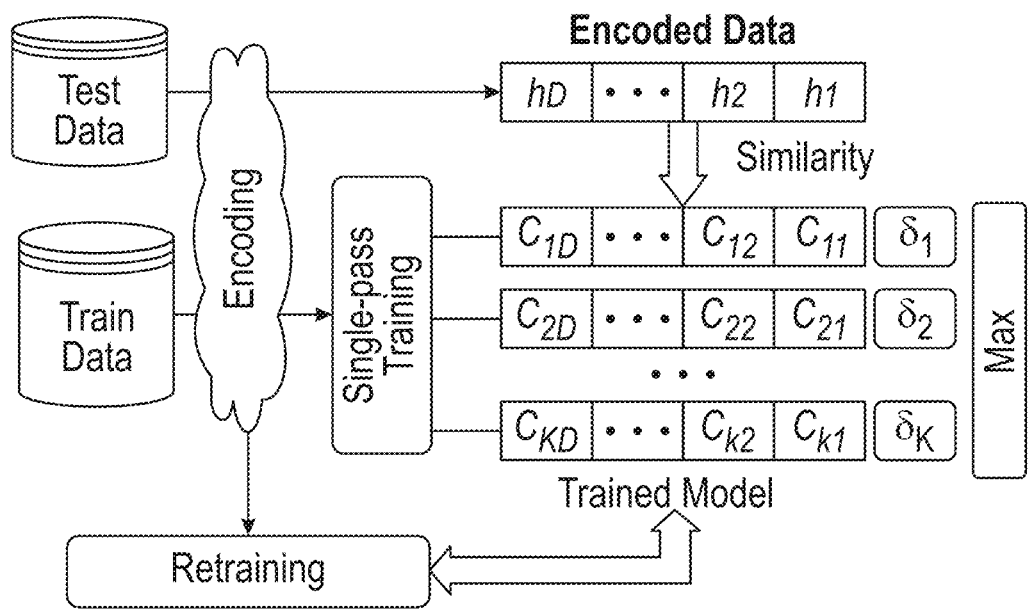

Inference: FIG. 6B is a diagram that depicts HDC classification steps. Inference of HDC starts by encoding the test data into high-dimensional space using the same encoding module used for training. The encoded data is called query hypervector $\vec{\mathcal{H}}$. Next, the similarity ($\delta$) of the query hypervector $\vec{\mathcal{H}}$ and all class hypervectors is compared to find a class with the highest similarity:

$$\delta(\vec{\mathcal{H}}, \vec{C}_l) = \frac{\vec{\mathcal{H}} \cdot \vec{C}_l}{\|\vec{\mathcal{H}}\| \cdot \|\vec{C}_l\|} \quad (6)$$

where $\|\vec{\mathcal{H}}\|$ is a common factor among all classes and thus can be removed from the similarity measurement. In addition, $\|\vec{C}_l\|$ is a fixed factor for each class and thus can be pre-calculated once.

Retraining: Retraining examines whether the model correctly returns the label l for an encoded query $\vec{\mathcal{H}}$. If the model mispredicts it as label l', the model updates as follows:

$$\vec{C}_l \leftarrow \vec{C}_l + \eta(\delta_l - \delta_{l'}) \times \vec{\mathcal{H}}$$

$$\vec{C}_{l'} \leftarrow \vec{C}_{l'} + \eta(\delta_l - \delta_{l'}) \times \vec{\mathcal{H}} \quad (7)$$

The retraining continues for multiple iterations until the classification accuracy (over validation data) has small changes during the last few iterations.

Clustering Provided by the NetHD System 10

Clustering is a native functionality supported by high-dimensional models. In high-dimensional space, HDC separates data points while still preserving their correlative distance. This enables low complexity and transparent separation of encoded data points. The similarity search is exploited in high-dimensional space to cluster data points into different centers.

Assume $\vec{\mathcal{H}}$ as a new training data point. The NetHD system automatically identifies the number of clusters and generates k random hypervectors as an initial cluster centers in high-dimensional space. Hyperdimensional computing stores original non-binary clusters ($\vec{C}_i$) and a binarized version ($\vec{C}_i^b$). The encoder module generates both non-binary ($\vec{\mathcal{H}}$) and binary ($\vec{\mathcal{H}}^b$) hypervectors. Each cluster center is updated using all data points assigned to the center as well as their corresponding confidence level. After assigning each encoding hypervector $\vec{\mathcal{H}}$ of inputs belonging to center/label l, the center hypervector $\vec{C}_l$ can be obtained by bundling (adding) all $\vec{\mathcal{H}}$ s. Assuming there are J inputs having label l, the cluster update happens using $\vec{C}_l \leftarrow \vec{C}_l + \Sigma_j^J \alpha_j \vec{\mathcal{H}}_j$, where $\vec{\mathcal{H}}_i$ is an encoded query data. All cluster updates are performed over the non-binary copy of the centers.

Data Compression

Hyperdimensional computing learning works naturally based on the randomness of vectors in HDC space. Hyperdimensional computing exploits a redundant and holographic representation; thus, a substantial number of bits can be corrupted while preserving sufficient information. The holographic data representation makes the learning process significantly robust against noise in data. As shown, HDC learning is mainly a superposition of encoded hypervectors. This superposition or bundling aims to create a compressed and representative model of all training data. In practice, the bundling can happen before or after sending the encoded data. However, bundling on the receiver is equivalent to a larger communication cost. Instead, the NetHD encoder can perform a part of those bundling operations during encoding to ensure holographic compressed data communication.

The NetHD encoder 12 (FIG. 1) bundles a batch of data into a single packet and transmits a compressed data packet to the receiver. With no need for decompression or data decoding, the NetHD encoder 12 starts learning a model over compressed transmitted data. This technique would overload the theoretical hypervector capacity. Since the goal is only to learn the pattern (not accurately decoding data on the receiver), learning provided by the NetHD system 10 can preserve a general pattern of compressed data. The rate of data compression, or in general coding rate, creates a trade-off between learning accuracy and communication cost. A larger compression reduces the communication cost, while it may affect the quality of learning. Subsequently, HDC is shown to be based on extremely high-dimensional hypervectors that are surprisingly robust to data compression.

Decoding Acceleration

In at least some embodiments, the associative search is the main computational operation used by the NetHD decoder 24 during decoding and learning. An in-memory computing accelerator supports the associative search. The architecture according to the present disclosure supports the search over complex values.

Nearest Search Operation Performed by the NetHD System 10

The NetHD system 10 is configured to perform encoding and decoding. Encoding by the NetHD encoder 12 is a single-iteration process that can be processed significantly faster on various hardware platforms, including an existing central processing unit. The higher encoding efficiency comes from the use of platforms with bit-level granularity. For instance, field-programmable gate array (FPGA) and application-specific integrated circuit architectures can be suitable platforms for the acceleration of the NetHD encoder 12. In some applications, the decoder 24 may be a costly iterative process that involves extensive nearest search operation. The search operation in existing processors has O(N) complexity. As equation 4 shows, each decoding iteration requires finding a better estimate for each stored chunk hypervector, that is, $C_i$. This requires checking the similarity of an estimated function, $\vec{\mathcal{P}}_i * \vec{\mathcal{H}}$ −Noise, with $\vec{\mathcal{F}}$ (C). Since $\vec{\mathcal{F}}$ (C) often consists of thousand patterns, this similarity comparison involves an extensively parallel search operation. The target of the search is to find a $\vec{\mathcal{F}}$ (C) row that has the highest similarity to the estimation.

The nearest search operation is also a common operation used for learning methods executed by the NetHD system 10. In both classification and clustering, the model training and inference phases rely on searching a similar query with class hypervectors. For clustering, the search is more dominant operations, and clustering performed by the NetHD system 10 needs to frequently compute the pairwise search between training data. In summary, decoding and learning provided by the NetHD system can significantly speed up if the nearest search operation can be accelerated in hardware.

Figure 7A:
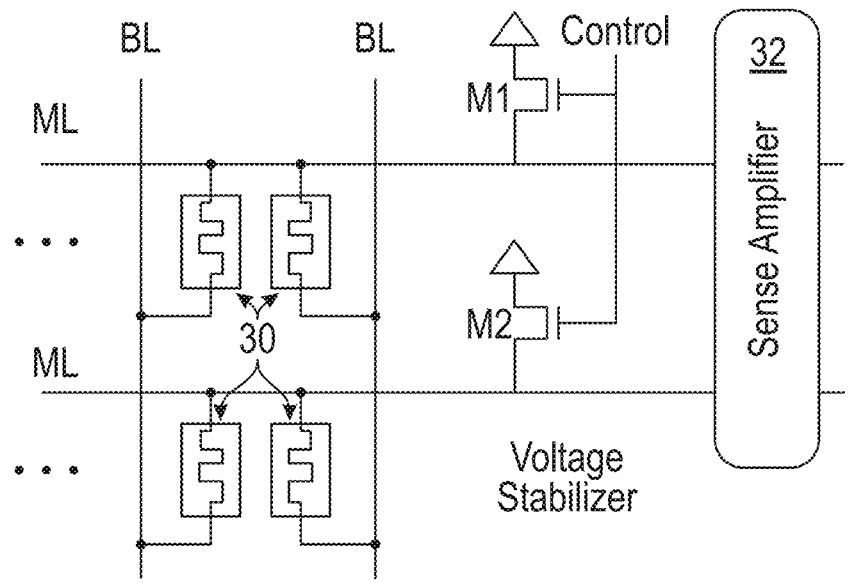
FIGS. 7A and 7B are diagrams showing the nearest search in content addressable memory and a data layout to support searching a number of complex hypervectors, respectively, according to the present disclosure.
Figure 7B:
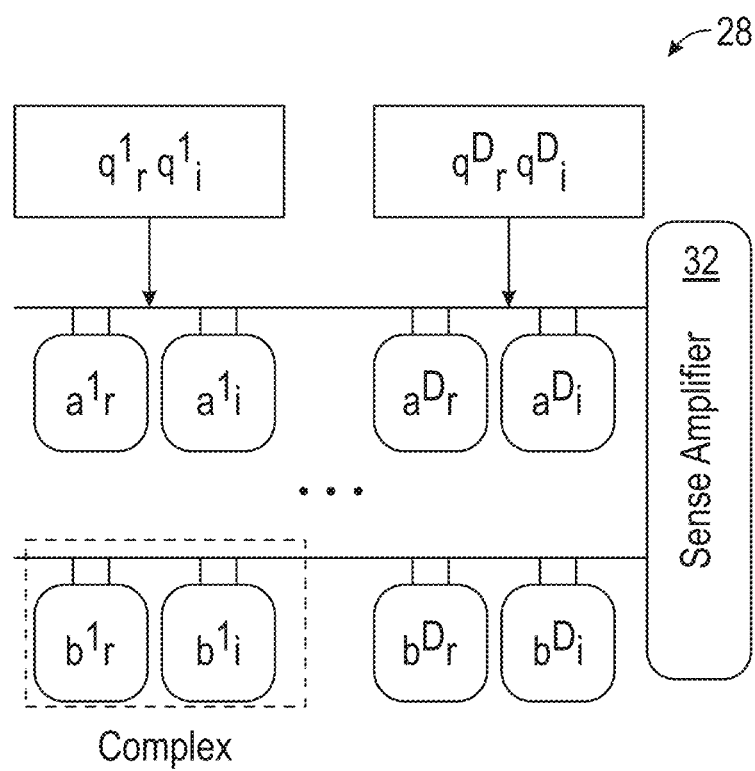

As depicted in the hardware schematic of FIG. 7A and operational diagram of FIG. 7B, a content addressable memory (CAM) 28 is exploited to support fast row-parallel search operations in memory as a hardware accelerator. The CAM 28 utilized in the form of lookup tables pre-stores all possibilities that the $\vec{\mathcal{F}}$ (C) function can get in different memory rows. Given a query vector, the goal is to return a row that is a match-line (ML) of the CAM 28 that has the highest similarity to query data. During learning, the CAM 28 can store the trained clustering or classification model and use it to compute the distance similarity of a query with pre-stored model hypervectors.

In-Memory Search Operation

The exact search is one of the native operations supported by the CAM 28. CAM cells 30 are made up of two memory cells storing complementary values, as shown in FIG. 7A. During a search, a row-driver (not shown) pre-charges all CAM MLs to supply voltage. The search operation starts by loading the input query into the vertical bit-lines (BLs) connected to all CAM rows. Traditionally, in case of a mismatch between the CAM cell 30 and the query data, the CAM starts discharging the MLs. In the present disclosure, an inverse CAM is used where inverted bits are stored in memory. The matched CAM cells 30 discharge the CAM row. A voltage stabilizer made up of field-effect transistors M1 and M2 connects the match-line to a constant supply voltage to ensure match-line voltage does not drop lower than supply voltage. This ensures that every mismatch has the same impact on the match-line discharging current. Finally, the nearest row can be identified by detecting a row of the CAM 28 that discharges first. A sense amplifier 32 is used as an analog current comparator that enables competition between different rows.

Due to the existing challenges in the crossbar memory, each memory block of the CAM 28 is assumed to have a size of 1K rows. Depending on the chunk size, there are configurations that the NetHD system 10 requires to search over up to 64K patterns. To ensure scalability, the hardware accelerator in the form of the CAM 28 according to the present disclosure enables the nearest search in parallel over all part of the CAM 28 with a row size of at least 1000. The result of the search is aggregated using a controller (not shown), which handles a remainder of the decoding process.

Search with Complex Hypervectors

The CAM 28 can support nearest Hamming distance operation. However, as previously explained, the NetHD system uses vectors with complex components. This representation creates a number of challenges: (1) The CAM 28 only stores binary values and cannot represent complex numbers, and (2) the complex values use dot product as a similarity metric that involves a complex conjugate operation. This distance similarity is different from Hamming distance supported by the CAM 28 according to the present disclosure. Disclosed is a technique that exploits the CAM 28 to store complex values and compute distance similarity. Assume $Q=q_r+q_c i$ and $A=a_r+a_c i$ as two complex numbers, indicating a single dimension of query and stored CAM pattern. The dot product between these two values is defined as follows:

$$C = Q \cdot \overline{A} = (q_r \oplus a_r + q_i \oplus a_i) + (q_i \oplus a_r + q_r \oplus a_i)i$$

Although this similarity involves inner product between complex numbers, in practice only a real portion of the dot product result is required. This simplifies the similarity metric to Hamming distance, where each dimension stores real and imaginary values as two adjacent cells of the memory cells 30. During the search, the CAM 28 computes the Hamming distance of both real and imaginary parts and accumulates its result as a discharging current on the match-line. In other words, using the complex number allows double dimensionality within the CAM 28.

Evaluation

Experimental Setup

The NetHD system 10 has been implemented and evaluated using software, hardware, and system modules. In software, encoding, decoding, and learning functionalities provided by the NetHD system 10 were verified using a C++ programming implementation. In hardware, the NetHD system 10 was implemented on multiple embedded platforms: a FPGA, a graphics processing unit, and a CAM-based accelerator according to the present disclosure. For the FPGA, the functionality of the NetHD system 10 was described using Verilog and was synthesized using Xilinx Vivado Design Suite. The synthesis code was implemented on the Kintex-7 FPGA KC705 Evaluation Kit using a clock frequency having a period of 5 ns. An optimized implementation of the NetHD system 10 was also created on a Jetson AGX Xavier embedded system-on-module.

Workloads

Table 1 summarizes the evaluated classification data sets. The tested benchmarks consist of canonical classification data sets such as voice recognition, smartphone context recognition, and a large data set for face recognition which includes hundreds of thousands of images. Four data sets were used for evaluation: (i) PECAN presents a dense urban area where a neighborhood may have hundreds of housing units. It has 52 houses observed over the period 2014 Jan. 1 to 2016 Dec. 31. In each house, a set of appliances instrumented with sensors recorded average energy consumption. The goal is to predict the level of power consumption in the urban area. The prediction results can be used for energy management in smart cities. (ii) PAMAP2 (physical activity monitoring) is a data set for human activity recognition which is widely used to understand user contexts. The data are collected by four sensors (three accelerometers and one heartbeat sensor), producing 75 features in total. (iii) APRI (application performance identification) is collected on a small server cluster that consists of three machines. The server cluster runs Apache Spark applications while collecting performance monitoring counter events on each server. The goal is to identify two workload groups depending on their computation intensity. (iv) PDP (power demand prediction) is collected on another high-performance computing cluster consisting of six servers. The goal is to identify either high or low power state of a server using performance monitoring counter measurements of other five servers in the cluster. The two data sets for the server systems provide the understanding for efficient task allocations in data centers and microgrids.

TABLE 1

Classification Data Sets

| | n | K | # End Nodes | Training Size | Test Size | Description |
|---|---|---|---|---|---|---|
| PECAN | 312 | 3 | 312 | 22,290 | 5,574 | Urban Electricity Prediction |
| PAMAP2 | 75 | 5 | 3 | 611,142 | 101,582 | Activity Recognition (IMU) |
| APRI | 36 | 2 | 3 | 67,017 | 1,241 | Performance Identification |
| PDP | 60 | 2 | 5 | 17,385 | 7,334 | Power Demand Prediction | n: feature size, K: number of classes.

The quality of clustering provided by the NetHD system 10 was evaluated on four data sets, including two large-scale synthetic data sets, as listed in Table 2. Measuring cluster quality relies on correct labels of data points and finding out how many points were classified in a cluster that does not reflect the label associated with the point.

TABLE 2

Clustering Data Sets

| | Data size | n | K | Description |
|---|---|---|---|---|
| MNIST | 70000 | 784 | 10 | Handwritten Digit Recognition |
| UCIHAR | 10299 | 561 | 6 | Human Activity Recognition |
| SYNTHET I | 1000 | 100 | 25 | Synthetic Data |
| SYNTHET II | 100000 | 100 | 25 | Synthetic Data | n: feature size, K: number of clusters.

NetHD System Parameters

The NetHD system 10 has primarily three parameters: the chunk size C, the dimension D, and the number of layers V. The chunk size is the number of bits encoded in each layer. The D denotes the number of channels being transmitted (dimensions), and V denotes the number of layers encoded in a single series transmitted. The total number of bits being transmitted is C×V, and so the coding rate is given by R=C×V/D. For example, in a typical setting, each layer transmits C=8 bits of information. If the number of layers chosen is V=8 and the dimension is D=128, then the coding rate is equal to R=64/128=0.5.

Bit Error Rate and Noise

Figure 8:
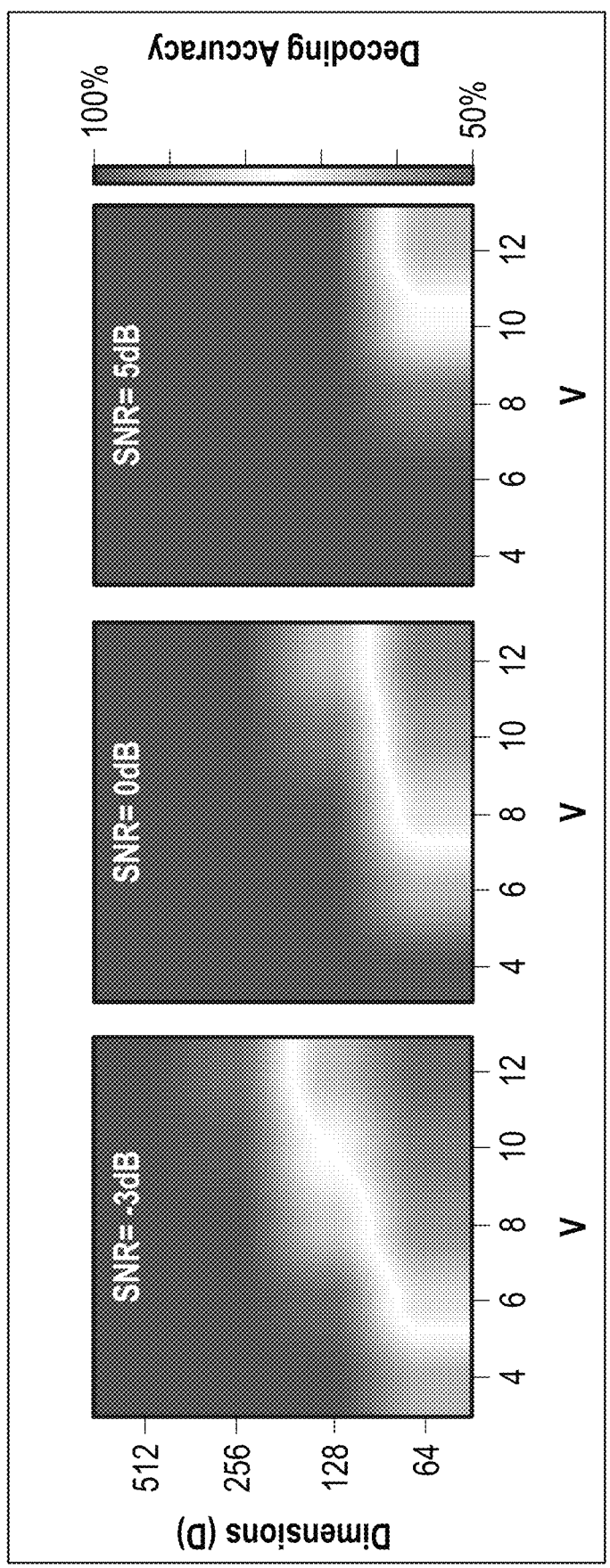
FIG. 8 is diagrams showing decoding accuracy from the NetHD decoder as a function of the number of layers and dimensionality in different signal-to-noise ratio (SNR) values.

The various bit error rates are reported as a function of dimensions D, layers V, and SNR (decibels). FIG. 8 is a diagram that illustrates the decoding accuracy of the NetHD system 10 as a function of dimension and layers for three different SNR values: −3 dB, 0 dB, and 5 dB. Regardless of the number of layers and SNR values, the decoding accuracy increases with the channel dimensionality. This is due to the increasing pseudo-orthogonality of random hypervectors in high-dimensional space. In other words, the dimensionality increases the chance of randomly generated chunk hypervectors to have distinct and orthogonal distribution and thus decreases the noise from cross-interference terms in Equation 3.

As explained previously, each hypervector has a limited capacity to memorize information. Increasing the number of layers, V, lowers the coding rate as the transmitted hypervector stores more chunk hypervectors. This increases the number of terms that contribute to cross-interference noise during the iterative content recovery. As a result, the iterative data decoding can have lower accuracy. FIG. 8 also shows that a lower SNR value can increase the relative magnitude of the noise. This causes errors in the recovery cycle, which causes a higher bit error rate. In a fixed number of layers, the NetHD system 10 with low SNR requires higher dimensionality to ensure highly accurate data decoding. For example, for V=8, the NetHD system 10 requires dimensionality of 256, 128, and 64 to ensure fully accurate data decoding for SNR of −3 dB, 0 dB, and 5 dB, respectively.

Figure 9A:
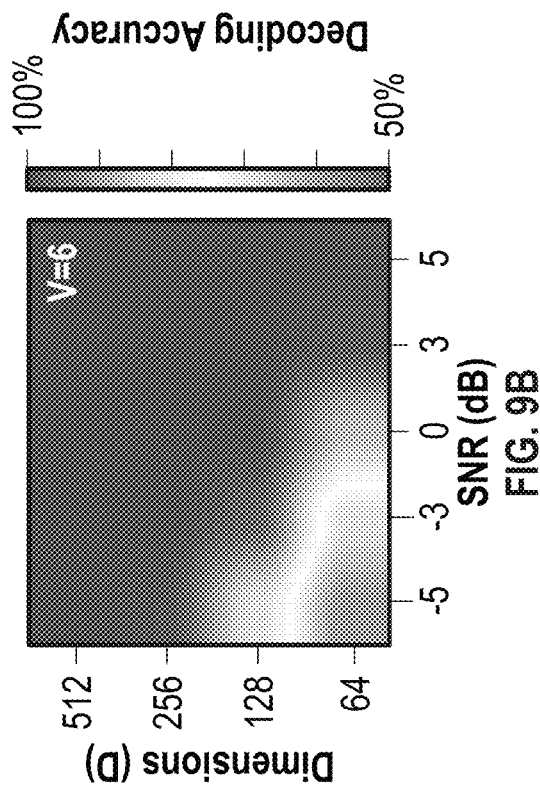
FIGS. 9A and 9B are diagrams showing decoding accuracy of the NetHD decoder in fixed dimensionality and in the number of layers, respectively, according to the present disclosure.
Figure 9B:
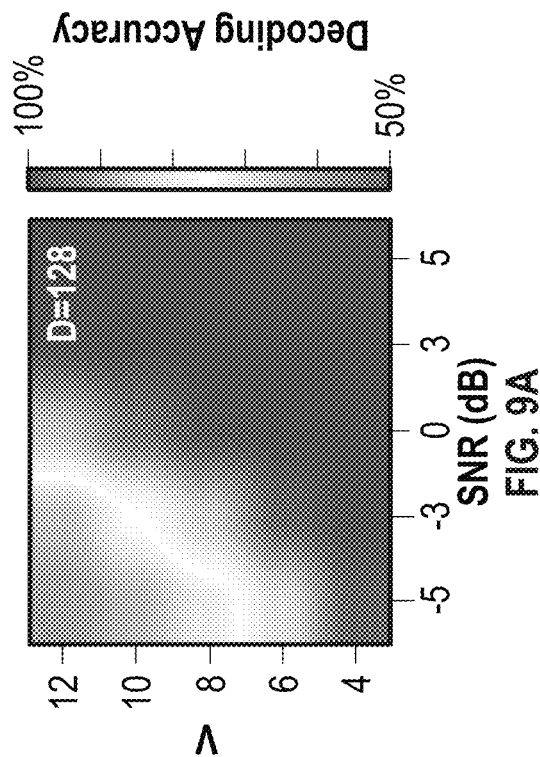

FIG. 9A is a diagram illustrating the decoding accuracy as a function of a number of layers, V, and SNR at D=128. As results show, increasing the SNR makes the main signal stronger, which reduces the cross-correlation errors in the iterative decoding method. Therefore, this results in increasing the decoding accuracy. Similarly, a larger number of layers, V, increases the cross-correlation noise and decoding accuracy of the NetHD decoder 24. FIG. 9B is a diagram illustrating the decoding accuracy as a function of dimension and SNR for V=6 layers. This level of dimensionality increases the chance of orthogonality of randomly generated hypervectors. This translates to lower decoding noise during data recovery.

Decoding Iterations

Figure 10B:
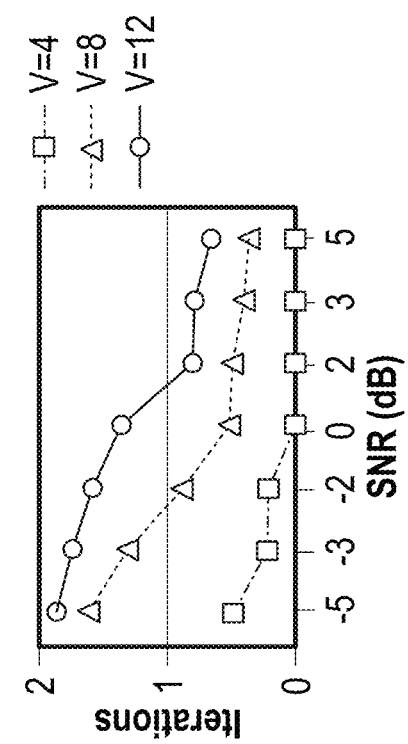
FIGS. 10A and 10B are graphs showing iterative decoding provided by the NetHD decoder with the average number of iterations and with the standard deviation over 20 experiments, respectively, according to the present disclosure.
Figure 10A:
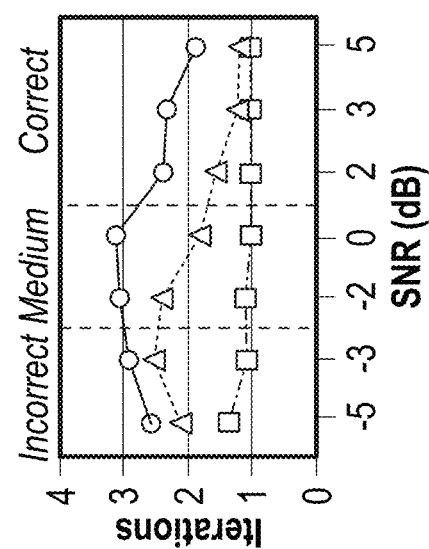

FIGS. 10A and 10B are diagrams illustrating the number of iterations required for convergence as a function of SNR for different configurations of the NetHD system 10. The results are the average number of iterations reported for 20 times of evaluation. The NetHD system 10 with a large SNR has smaller noise; this can accurately decode data with a lower number of iterations. As the SNR decreases, the transmitted signal gets higher noise from the network; thus, the NetHD decoder 24 requires more iterations for data decoding. As FIGS. 10A and 10B show, the NetHD decoder 24 requires a maximum number of iterations for SNRs in range of −2 dB to +2 dB. With lowering the SNR below −2 dB, decoding by the NetHD decoder 24 can recover information with a few iterations. This happens because the NetHD decoder 24 cannot ensure accurate data decoding in a highly noisy network. This causes the converged decoded signal to be high in error and random, which requires a lower number of iterations to attain. As a result, greater variations in the number of iterations are observed when the signal strength decreases. The NetHD decoder 24 with a larger number of layers gets higher cross-interference noise and thus results in greater variation and the number of decoding iterations.

Figure 11A:
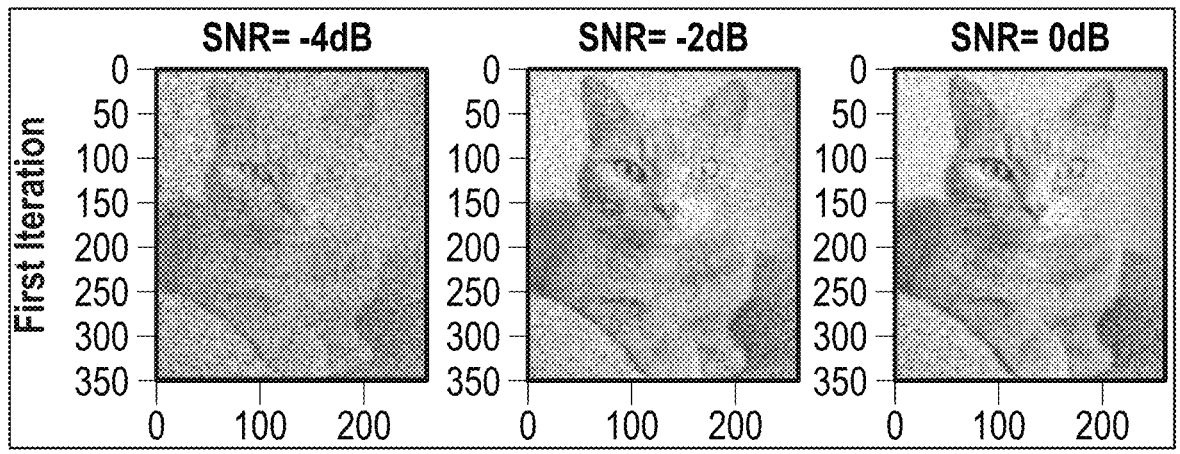
FIGS. 11A and 11B are diagrams showing visual decoding provided by the NetHD decoder during different decoding iterations and under different SNR values.
Figure 11B:
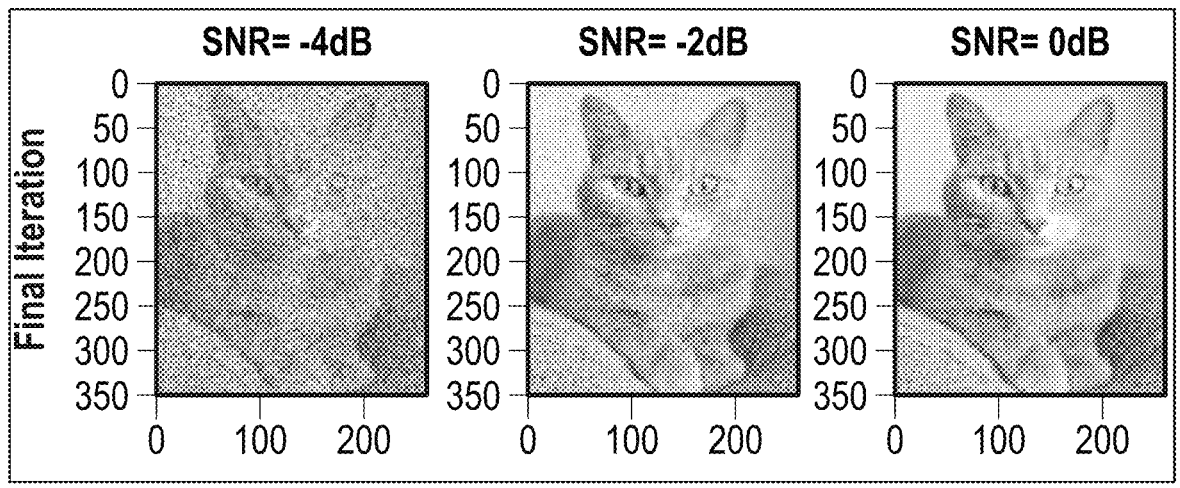

FIGS. 11A and 11B are diagrams visually showing the quality of decoding by the NetHD decoder 24 during different decoding iterations and using networks with various SNR values (V=6, D=64). The result indicates that, regardless of the SNR value, decoding accuracy provided by the NetHD decoder 24 increases with the number of iterations. However, the decoding accuracy at the final iteration can still be imperfect when an image is transmitted over a low SNR network. For example, a decoded image under SNR=−2 dB has a small amount of noise, while an image can be decoded perfectly under SNR=0 dB.

The NetHD Decoder Vs. State-of-the-Art

Figure 12A:
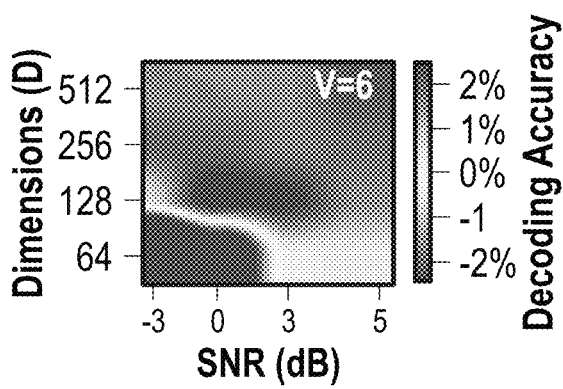
FIGS. 12A and 12B are diagrams showing the difference in decoding accuracy between the NetHD decoder and the state-of-the-art modulation, respectively, with the regions beyond the left and right lower corners, respectively, showing the NetHD decoder outperforming the state-of-the-art modulation.
Figure 12B:
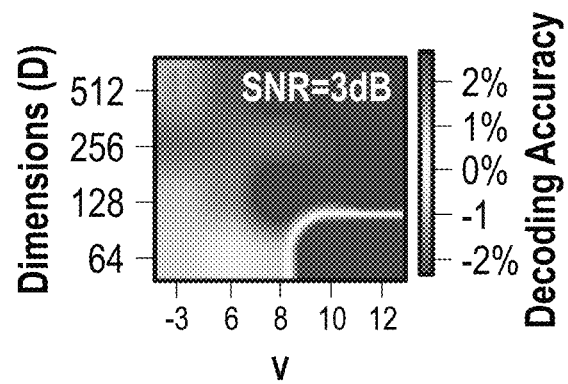

The decoding accuracy provided by the NetHD decoder 24 was compared with the state-of-the-art hyperdimensional modulation (HDM). FIGS. 12A and 12B are diagrams depicting the difference between decoding accuracy of the NetHD decoder 24 and HDM under various SNR values and using a different number of layers. All results are reported when both the NetHD decoder 24 and HDM have the same coding rate (R=0.5). The results indicate that in most configurations, the NetHD decoder 24 outperforms HDM in terms of decoding accuracy, specifically in regions of low noise and a small number of layers. Returning to FIGS. 9A and 9B, the NetHD decoder 24 has a 100% accuracy in these regions, while the HDM enables approximate decoding, because the HDM model encodes the vectors in a non-random way, whereas the model according to the present disclosure generates all the lookup basis randomly, thus ensuring pseudo-orthogonal chunk representation. As a result, the model according to the present disclosure essentially does an exact search over all the layers, resulting in substantially ideal data decoding.

The HDM accuracy of decoding is better than that of the NetHD decoder 24 in conditions of low SNR and a high number of layers. In these configurations, the NetHD decoder 24 has higher vulnerability, as the noise can modify the similarity such that two different random vectors which might have greater similarities can be confused with each other. In addition, the NetHD decoder 24 fundamentally works based on the nearly orthogonal distribution of patterns in high-dimensional space. In low-dimensional space, the vector cannot ensure the orthogonality of hypervectors and thus increases the cross-interference noise. As FIG. 12A shows, for low SNR signals, the NetHD decoder 24 should use larger dimensionality to reduce the impact of interference noises and thus improve the quality of decoding. Similarly, using a large number of layers, the NetHD decoder 24 requires higher dimensionality to ensure that the capacity of an encoded hypervector does not overpass the V value, as shown in FIG. 12B.

Learning Accuracy Provided by the NetHD System

Figure 13A:
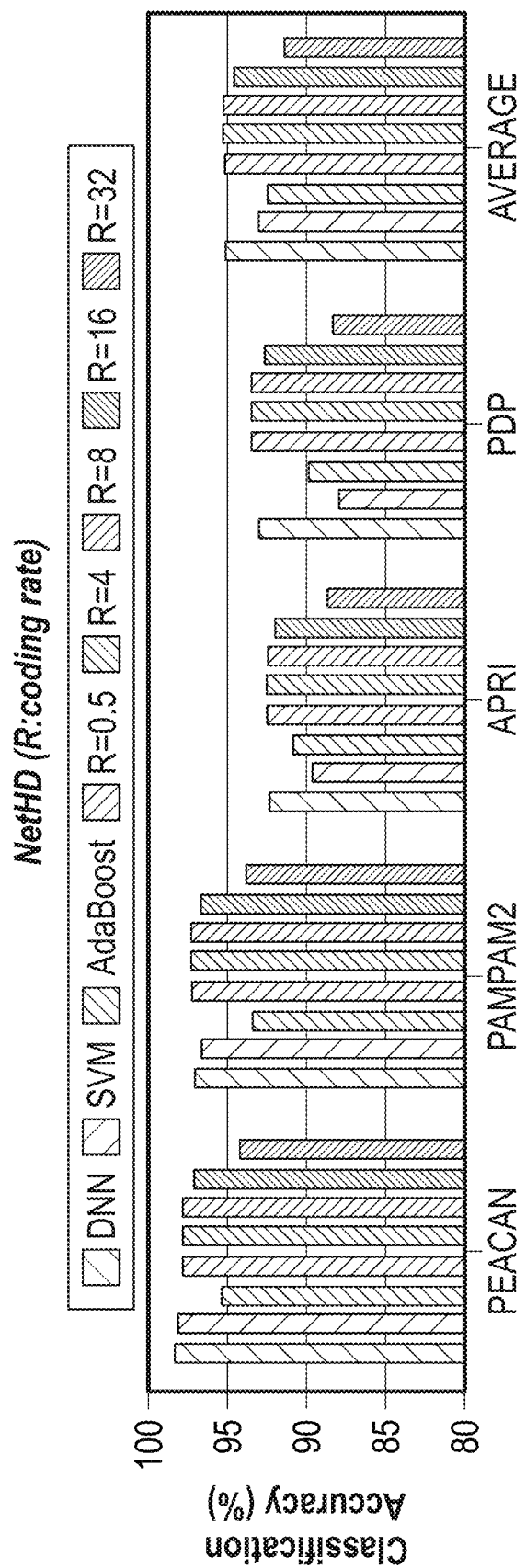
FIGS. 13A and 13B are diagrams showing the NetHD system quality of learning classification and clustering, respectively, versus state-of-the-art and during different coding rates.
Figure 13B:
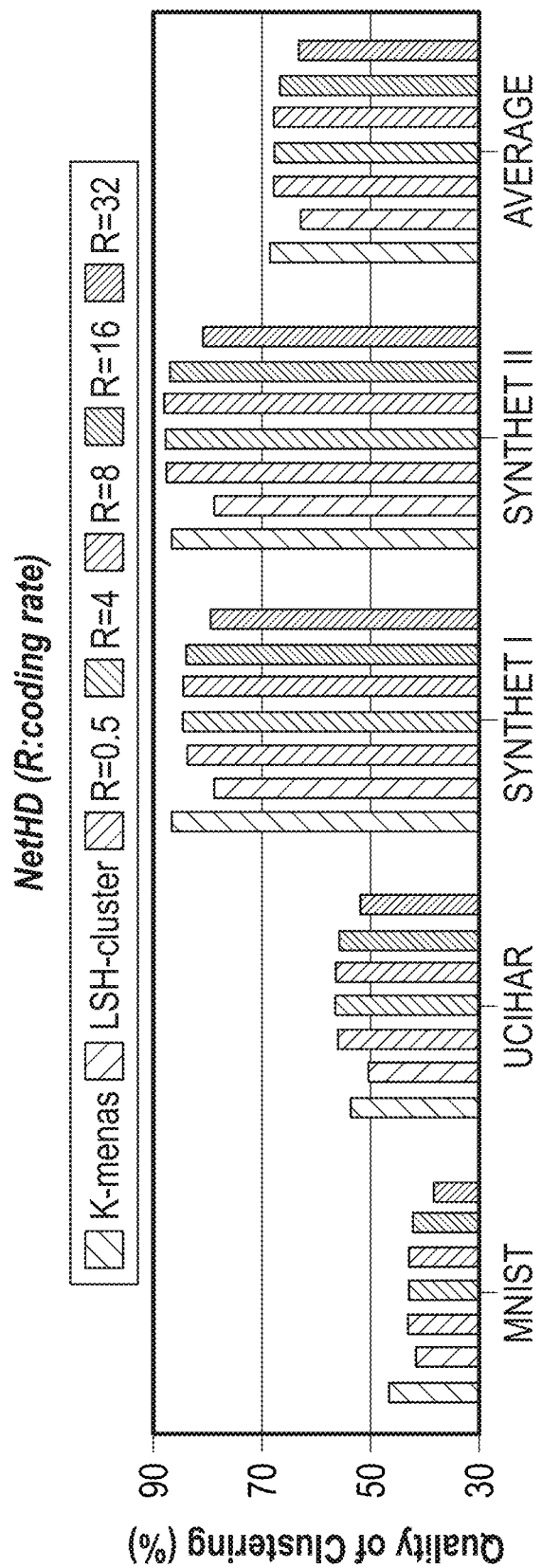

NetHD Learning Accuracy: FIGS. 13A and 13B are diagrams comparing classification accuracy provided by the NetHD system 10 with the state-of-the-art classification algorithms, including deep neural network (DNN), support vector machine (SVM), and AdaBoost. The results are reported when all algorithms are performing in a central node that considers all features given in the data set. The DNN models are trained with Tensorflow, and the Scikit-learn library was used for the other algorithms. The common practice of the grid search was used to identify the best hyperparameters for each model. The evaluation shows that the NetHD system 10 provides comparable accuracy to state-of-the-art learning solutions while operating over noisy encoded data.

FIG. 13B compares the quality of clustering provided by the NetHD system 10 with the state-of-the-art clustering approaches: k-means and locality sensitive hashing (LSH-cluster) that clusters data after mapping data into high-dimensional space. The k-means algorithm is working on original data and uses Euclidean distance as a similarity metric. Other approaches map data points into D=4k dimensions before performing clustering. For LSH and HOC-based clustering, the results are reported using the cosine metric. The evaluation shows that the NetHD system 10 provides comparable quality of clustering to k-means, which is significantly higher than that of the LSH-based approach.

Coding Rate: Accuracy provided by the NetHD system 10 was also compared in different configurations. The NetHD system 10 accuracy depends on both dimensionality and the number of chunks. These two parameters are correlated as they determine the capacity of each hypervector for memorization. An increase in dimensionality improves hypervector capacity and thus results in a higher quality of learning. In other words, with higher dimensionality, class hypervectors can store information of more data points and learn sophisticated models. On the other hand, increasing the number of chunks results in higher data compression by storing more encoded data in each class hypervector. As explained previously, to ensure nearly accurate data decoding, the coding rate should be a value around R=0.5 or lower. However, learning algorithms are approximate and are not required to ensure accurate data decoding.

The results indicate that the NetHD system 10 can enable accurate learning over highly compressed data with a high coding rate. The high robustness of learning to compression provided by the NetHD system 10 comes from two factors: (1) Data compression is holographic, where the compressed data mathematically memorizes the information of each individual encoded data, and (2) the compression uses the same superposition or bundling operation used for model training. Evaluation indicates that the NetHD system 10 can ensure maximum classification accuracy using 16× smaller data (R=8). Even aggressive model compression of 32× (R=16) and 64× (R=32) only adds 0.7% and 3.9% quality loss, respectively, to HDC classification. As FIG. 13B shows, the HDC clustering algorithm has a similar robustness to data compression. Clustering a batch of encoded data results in generating a model with similar quality to baseline clustering. Evaluation shows that the NetHD system 10 ensures no quality loss (less than 0.4%) for clustering with 16× (32×) data compression, thus resulting in a significant reduction in data communication.

Efficiency Provided by the NetHD System

Figure 14A:
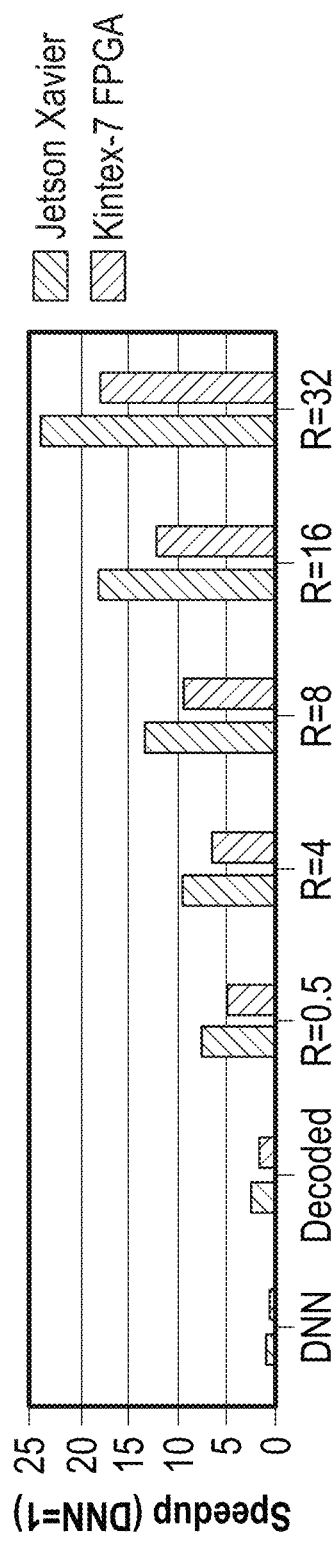
FIGS. 14A and 14B are diagrams showing learning speedup and energy efficiency provided by the NetHD system, respectively, in different configurations and over different platforms (results normalized to a Jetson Xavier embedded system-on-module running deep neural network).
Figure 14B:
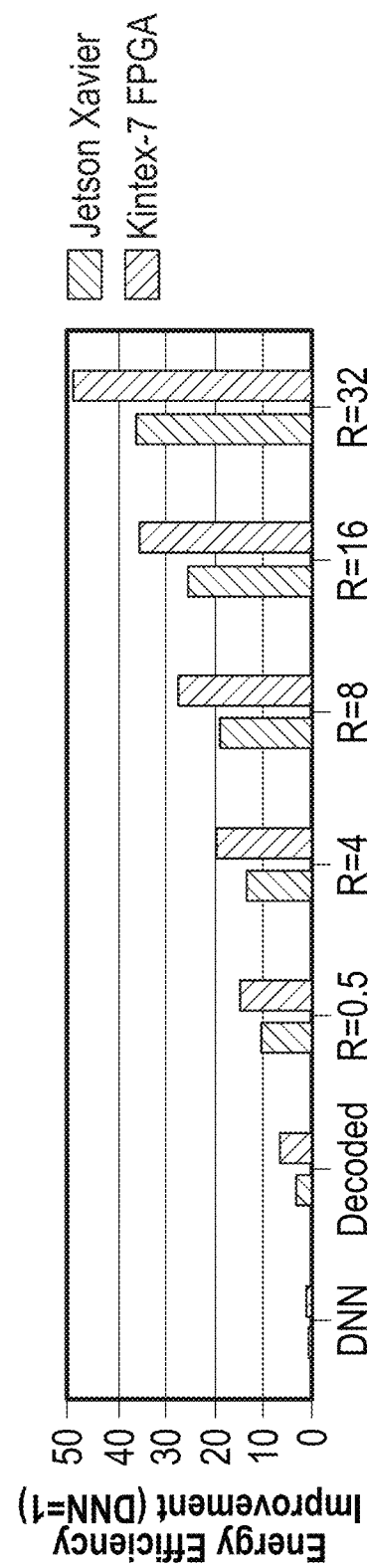

FIGS. 14A and 14B compare training efficiency provided by the NetHD system with DNN in different configurations. The results are reported for both an FPGA implementation and a Jetson Xavier embedded system-on-module. The results include both communication and computation cost. While the DNN training always performs over decoded data in a receiver, learning provided by the NetHD system 10 can perform in two configurations: (1) after decoding: transmitted data first gets demodulated, and then a learning task is performed over the data; and (2) after encoding: directly learning over transmitted data with no need for decoding.

Learning after decoding has significant computational overhead, as (i) it requires exploiting iterative decoding process and (ii) it relies on expensive encoding to map encoded data back to high-dimensional space. In contrast, without decoding, the Net HD system 10 can directly operate over transmitted data. Evaluation shows that the NetHD system 10 without decoding (after decoding) can provide 7.3× and 10.5× (2.8× and 4.2×) faster speed and higher energy efficiency compared with DNN, respectively. Comparing the FPGA and the NVIDIA Jetson Xavier embedded system-on-module, the NetHD system provides higher computation performance using the NVIDIA Jetson Xavier embedded system-on-module, while using the FPGA, the NetHD encoder provides higher energy efficiency.

Efficiency and Compression: FIGS. 14A and 14B are diagrams showing the impact of coding rate (data compression) on learning efficiency provided by the NetHD system 10. The efficiency values are averaged among classification and clustering applications. Evaluation shows that learning efficiency provided by the NetHD system 10 improves with increasing the coding rate. This efficiency comes from the following: (1) a larger coding rate that reduces the communication cost by transferring a more compressed information through the network. The reduction in communication cost is linear with the coding rate. (2) A large coding rate also improves learning efficiency, as the HDC models can be trained using a fewer number of training data in a compressed form. Implementing the NetHD system 10 on the FPGA using R=8 (R=32) results in 5.1× and 3.8× (9.5× and 6.7×), respectively, faster coding and improved energy efficiency compared with a baseline of the NetHD system 10 operating on decoded data.

The NetHD encoder 12 introduces a general encoding scheme that processes arbitrary bit-streams while preserving spatial-temporal information. Data encoded by the NetHD encoder 12 may be directly used for learning or iteratively decoded back to original space. The NetHD system 10 is orthogonal and can use the hardware accelerators to speed up NetHD encoding and learning processes. In addition, the NetHD system 10 is configured to merge HDM and learning to maximize the benefit of both HDM and learning.

Moreover, a redundant and holographic representation of HDC vectors is used to realize a highly robust data transmission protocol. Instead of transmitting original data with costly modulation and error correction, hyperdimensional data transmission is disclosed with encoding methods that map data into high-dimensional space and transmit the encoded data through the network. The encoded data can be directly used at the destination node to perform a wide range of HDC-based learning and cognitive tasks or accurately decode data back to the original space. Since HDC encoding spreads the data over a large hypervector, a substantial number of bits can be corrupted while preserving sufficient information, resulting in high noise robustness.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A network-based hyperdimensional system comprising:
an encoder implemented in hardware and configured to:
receive input data in a bitstream;
divide the bit stream into chunks;
generate chunk hypervectors from the chunks;
generate a position hypervector for each chunk hypervector;
bind each position hypervector with each associated chunk hypervector to generate bound hypervectors; and
add the bound hypervectors together to generate encoded data bits; and
a decoder implemented in hardware and configured to:
receive the encoded data bits over a network; and
decode the encoded data bits by comparing predetermined bit sequences with the encoded data bits until a convergence to a maximum match between the predetermined bit sequences and the encoded data bits occurs within a finite number of decoding iterations and thereby reconstruct the input data from the decoded data bits.

2. The network-based hyperdimensional system of claim 1 wherein the finite number of decoding iterations is between 1 and 10.

3. The network-based hyperdimensional system of claim 1 wherein no error correction is performed by the decoder.

4. The network-based hyperdimensional system of claim 1 wherein the decoder further comprises a hardware accelerator with content addressable memory (CAM) that stores the predetermined bit sequences in a look-up table.

5. The network-based hyperdimensional system of claim 4 wherein the CAM is configured for row-parallel search operations.

6. The network-based hyperdimensional system of claim 4 wherein the CAM is configured for searching hypervectors that have real and imaginary components.

7. The network-based hyperdimensional system of claim 6 wherein both the real and imaginary components are nonzero.

8. The network-based hyperdimensional system of claim 6 wherein the real and imaginary components are stored in adjacent memory cells of the CAM.

9. The network-based hyperdimensional system of claim 8 wherein the CAM is further configured to determine Hamming distance of both the real and imaginary components.

10. The network-based hyperdimensional system of claim 9 wherein the CAM is configured to determine the Hamming distances by sensing discharging current on match-lines that are CAM rows.

11. The network-based hyperdimensional system of claim 1 wherein the encoded data represent a totality of the bit stream.

12. The network-based hyperdimensional system of claim 1 wherein the encoder is configured to operate based on parameters that include but are not limited to chunk size C representing a total number of bits to be transmitted per layer, dimension D representing a number of channels to be transmitted, and a number of layers V to be encoded.

13. The network-based hyperdimensional system of claim 12 wherein the chunk size C multiplied by the number of layers V to be encoded is equal to the total number of bits to be transmitted.

14. The network-based hyperdimensional system of claim 13 wherein a coding rate of the encoder is equal to the total number of bits to be transmitted C×V divided by the dimension D.

15. The network-based hyperdimensional system of claim 1 wherein the encoder and decoder hardware implementations include but are not limited to field programmable gate arrays, graphics processing units, central processing units and CAM.

16. The network-based hyperdimensional system of claim 1 wherein the HDC is configured to perform single-pass training.

17. The network-based hyperdimensional system of claim 1 further comprising a learning module that is configured to perform classification and clustering of the input data.

18. The network-based hyperdimensional system of claim 1 wherein the encoder is configured to provide dynamic data compression during encoding of the input data.

* * * * *